United States Patent
Kondo

(10) Patent No.: US 10,861,557 B2
(45) Date of Patent: Dec. 8, 2020

(54) SEMICONDUCTOR STORAGE APPARATUS

(71) Applicant: Kioxia Corporation, Minato-ku (JP)

(72) Inventor: Shigeo Kondo, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/712,178

(22) Filed: Dec. 12, 2019

(65) Prior Publication Data

US 2020/0194078 A1    Jun. 18, 2020

(30) Foreign Application Priority Data

Dec. 13, 2018 (JP) .................. 2018-233591

(51) Int. Cl.
| | |
|---|---|
| G11C 16/12 | (2006.01) |
| G11C 16/08 | (2006.01) |
| G11C 16/26 | (2006.01) |
| G11C 16/34 | (2006.01) |
| G11C 16/04 | (2006.01) |
| G11C 11/56 | (2006.01) |

(52) U.S. Cl.
CPC .......... *G11C 16/12* (2013.01); *G11C 16/0483* (2013.01); *G11C 16/08* (2013.01); *G11C 16/26* (2013.01); *G11C 16/3459* (2013.01); *G11C 11/5671* (2013.01)

(58) Field of Classification Search
CPC .............. G11C 16/12; G11C 16/3459; G11C 16/0483; G11C 16/26; G11C 16/08; G11C 11/5671; G11C 16/10; G11C 11/5628
See application file for complete search history.

(56) References Cited

U.S. PATENT DOCUMENTS

| | | | |
|---|---|---|---|
| 7,848,144 B2 | 12/2010 | Lasser | |
| 8,310,870 B2 | 11/2012 | Dutta et al. | |
| 8,339,855 B2 | 12/2012 | Lasser | |
| 8,751,888 B2 | 6/2014 | Kamigaichi et al. | |
| 9,640,274 B1 | 5/2017 | Kondo | |
| 2016/0300619 A1* | 10/2016 | Dutta | G11C 16/3459 |
| 2017/0263326 A1* | 9/2017 | Kondo | G11C 16/10 |
| 2018/0068739 A1* | 3/2018 | Shiino | G11C 16/10 |
| 2018/0075902 A1* | 3/2018 | Shirakawa | G11C 16/0483 |
| 2019/0156904 A1* | 5/2019 | Hong | G06F 3/0688 |
| 2019/0311772 A1* | 10/2019 | Diep | G11C 16/14 |

FOREIGN PATENT DOCUMENTS

| | | |
|---|---|---|
| JP | 2011-524600 A | 9/2011 |
| JP | 2017-168165 A | 9/2017 |

* cited by examiner

*Primary Examiner* — Tri M Hoang
(74) *Attorney, Agent, or Firm* — Oblon, McClelland, Maier & Neustadt, L.L.P.

(57) ABSTRACT

A semiconductor storage apparatus includes: a memory cell array provided with memory cells; a word line connected to each gate of the memory cells; bit lines connected respectively to ends of the memory cells; and a control circuit. The control circuit controls a word line driver and a sense amplifier circuit to perform a first programming pass for programming data of states each of which has a first threshold distribution width to the memory cells and a second programming pass for programming data of the states each of which has a second threshold distribution width narrower than the first threshold distribution width to the memory cells, the second programming pass being performed after the first programming pass, and the first programming pass includes at least one first verify operation and one or more additional program operations.

10 Claims, 22 Drawing Sheets

FIG. 6

| Page | DEr | DS1 | DS2 | DS3 | DS4 | DS5 | DS6 | DS7 | DS8 | DS9 | DS10 | DS11 | DS12 | DS13 | DS14 | DS15 |
|---|---|---|---|---|---|---|---|---|---|---|---|---|---|---|---|---|
| Higher | 1 | 1 | 0 | 0 | 0 | 1 | 0 | 0 | 0 | 1 | 1 | 1 | 1 | 0 | 0 | 0 |
| Upper | 1 | 0 | 0 | 0 | 1 | 1 | 1 | 1 | 1 | 1 | 0 | 0 | 1 | 1 | 0 | 0 |
| Middle | 1 | 1 | 1 | 0 | 0 | 0 | 0 | 1 | 1 | 1 | 1 | 0 | 0 | 0 | 0 | 1 |
| Lower | 1 | 1 | 1 | 1 | 1 | 1 | 1 | 1 | 0 | 0 | 0 | 0 | 0 | 0 | 0 | 0 |
| DISTRIBUTION | | | | | | | | | | | | | | | | |

FIG. 13

|  |  | SU0 | SU1 | SU2 | SU3 |
|---|---|---|---|---|---|
| WL7 | FINE PROGRAMMING | ... | ... | ... | ... |
|  | FOGGY PROGRAMMING | ... | ... | ... | ... |
| ⋮ | ⋮ | ⋮ | ⋮ | ⋮ | ⋮ |
| WL2 | FINE PROGRAMMING | ... | ... | ... | ... |
|  | FOGGY PROGRAMMING | 13 | 14 | 15 | 16 |
| WL1 | FINE PROGRAMMING | 17 | 18 | 19 | 20 |
|  | FOGGY PROGRAMMING | 5 | 6 | 7 | 8 |
| WL0 | FINE PROGRAMMING | 9 | 10 | 11 | 12 |
|  | FOGGY PROGRAMMING | 1 | 2 | 3 | 4 |

FIG. 16

| | FS1 | FS3/FS5/FS7 FS9/FS11/FS13/FS15 | FS2/FS4/FS6 FS8/FS10/FS12/FS14 |
|---|---|---|---|
| Verify-high DIRECTLY PASSED | Inhibit | 0V | APPLY QPW VOLTAGE Vbl_qpw |
| Verify-low PASSED | APPLY QPW VOLTAGE Vbl_qpw | APPLY QPW VOLTAGE Vbl_qpw | 0V |

FIG. 17

| STATE | FS1 | FS2 | FS3 | FS4 | FS5 | FS6 | FS7 | FS8 | FS9 | FS10 | FS11 | FS12 | FS13 | FS14 | FS15 |
|---|---|---|---|---|---|---|---|---|---|---|---|---|---|---|---|
| GROUP | 1 | 3 | 2 | 3 | 2 | 3 | 2 | 3 | 2 | 3 | 2 | 3 | 2 | 3 | 2 |
| ADDITIONAL PROGRAMMING COUNT | 0 | 1 | 1 | 2 | 2 | 3 | 3 | 4 | 4 | 5 | 5 | 6 | 6 | 7 | 7 |
| Verify-low PASSED Verify-high FAILED BIT LINE VOLTAGE | + | 0 | + | 0 | + | 0 | + | 0 | + | 0 | + | 0 | + | 0 | + |
| Verify-high DIRECTLY PASSED BIT LINE VOLTAGE | − | + | 0 | + | 0 | + | 0 | + | 0 | + | 0 | + | 0 | + | 0 |

FIG. 18

| | FS1/FS8 | FS3/FS5/FS7 FS10/FS12/FS14 | FS2/FS4/FS6 FS9/FS11/FS13/FS15 |
|---|---|---|---|
| Verify-high DIRECTLY PASSED | Inhibit | 0V | APPLY QPW VOLTAGE Vbl_qpw |
| Verify-low PASSED | APPLY QPW VOLTAGE Vbl_qpw | APPLY QPW VOLTAGE Vbl_qpw | 0V |

FIG. 19

| STATE | FS1 | FS2 | FS3 | FS4 | FS5 | FS6 | FS7 | FS8 | FS9 | FS10 | FS11 | FS12 | FS13 | FS14 | FS15 |
|---|---|---|---|---|---|---|---|---|---|---|---|---|---|---|---|
| GROUP | 1 | 3 | 2 | 3 | 2 | 3 | 2 | 1 | 3 | 2 | 3 | 2 | 3 | 2 | 3 |
| ADDITIONAL PROGRAMMING COUNT | 0 | 1 | 1 | 2 | 2 | 3 | 3 | 0 | 1 | 1 | 2 | 2 | 3 | 3 | 4 |
| Verify-low PASSED Verify-high FAILED BIT LINE VOLTAGE | + | 0 | + | 0 | + | 0 | + | + | 0 | + | 0 | + | 0 | + | 0 |
| Verify-high DIRECTLY PASSED BIT LINE VOLTAGE | − | + | 0 | + | 0 | + | 0 | − | + | 0 | + | 0 | + | 0 | + |

FIG. 23

| | FS1/FS4/FS8/FS12 | FS3/FS6/FS10/FS14 | FS2/FS5/FS7/FS9/FS11/FS13/FS15 |
|---|---|---|---|
| Verify-high DIRECTLY PASSED | Inhibit | 0V | APPLY QPW VOLTAGE Vbl_qpw |
| Verify-low PASSED | APPLY QPW VOLTAGE Vbl_qpw | APPLY QPW VOLTAGE Vbl_qpw | 0V |

FIG. 24

| GROUP | FS1 | FS2 | FS3 | FS4 | FS5 | FS6 | FS7 | FS8 | FS9 | FS10 | FS11 | FS12 | FS13 | FS14 | FS15 |
|---|---|---|---|---|---|---|---|---|---|---|---|---|---|---|---|
| ADDITIONAL PROGRAMMING COUNT | 1 | 3 | 2 | 1 | 3 | 2 | 3 | 1 | 3 | 2 | 3 | 1 | 3 | 2 | 3 |
| Verify-low PASSED Verify-high FAILED BIT LINE VOLTAGE | 0 | 1 | 1 | 0 | 1 | 1 | 2 | 0 | 1 | 1 | 2 | 0 | 1 | 1 | 2 |
|  | + | 0 | + | + | 0 | + | 0 | + | 0 | + | 0 | + | 0 | + | 0 |
| Verify-high DIRECTLY PASSED BIT LINE VOLTAGE | − | + | 0 | − | + | 0 | + | − | + | 0 | + | − | + | 0 | + |

FIG. 25

| | FS1 | FS2 | FS3 | FS4 | FS5 | FS6 | FS7 | FS8 | FS9 | FS10 | FS11 | FS12 | FS13 | FS14 | FS15 |
|---|---|---|---|---|---|---|---|---|---|---|---|---|---|---|---|
| ADDITIONAL PROGRAMMING COUNT (CELL THAT PASSED Verify-low BUT FAILED IN Verify-high) | 1 | 1 | 2 | 2 | 3 | 3 | 4 | 1 | 1 | 2 | 2 | 3 | 3 | 4 | 4 |
| ADDITIONAL PROGRAMMING COUNT (CELL THAT DIRECTLY PASSED Verify-high) | 0 | 1 | 1 | 2 | 2 | 3 | 3 | 0 | 1 | 1 | 2 | 2 | 3 | 3 | 4 |
| Verify-low PASSED Verify-high PASSED BIT LINE VOLTAGE | + | 0 | + | 0 | + | 0 | + | + | 0 | + | 0 | + | 0 | + | 0 |
| Verify-high DIRECTLY PASSED BIT LINE VOLTAGE | − | + | 0 | + | 0 | + | 0 | − | + | 0 | + | 0 | + | 0 | + |

SEMICONDUCTOR STORAGE APPARATUS

CROSS-REFERENCE TO RELATED APPLICATION

This application is based upon and claims the benefit of priority from the prior Japanese Patent Application No. 2018-233591 filed in Japan on Dec. 13, 2018; the entire contents of which are incorporated herein by reference.

FIELD

An embodiment described herein relates generally to a semiconductor storage apparatus.

BACKGROUND

In a NAND-type flash memory, a memory cell may be configured not only as an SLC (single-level cell) capable of holding 1-bit (2-valued) data but as an MLC (multi-level cell) capable of holding 2-bit (4-valued) data, a TLC (triple-level cell) capable of holding 3-bit (8-valued) data or a QLC (quadruple-level cell) capable of holding 4-bit (16-valued) data.

In a data write operation for programming data to memory cells, a program operation and a verify operation are executed a plurality of times. The higher the multi-valued level of a memory cell is, the narrower the threshold voltage distribution width of each value is required to be. Therefore, the number of program operations and verify operations executed in the data write operation tends to increase, and a data programming time period becomes longer.

BRIEF DESCRIPTION OF THE DRAWINGS

FIG. 6 is a diagram showing data coding of the present embodiment;

FIG. 13 is a diagram showing an example of execution order of a first programming pass and a second programming pass according to the embodiment;

FIG. 16 is a table showing an example of classification of programming states into groups and setting of a bit line voltage in an additional program operation for each group according to the embodiment;

FIG. 17 is a table showing the number of executions of the additional program operation and setting of a bit line voltage for a memory cell in each state according to the embodiment;

FIG. 18 is a table showing an example of classification of the programming states into groups in the case of executing the verify operation for predetermined two states, and settings of bit line voltages in the additional program operation of each group, according to a modified embodiment 1 of the embodiment;

FIG. 19 is a table showing the number of executions of the additional program operation and setting of a bit line voltage for a memory cell in each state according to the modified embodiment 1 of the embodiment;

FIG. 23 is a table showing an example of classification of the programming states into groups in the case of executing the verify operation for predetermined four states, and settings of bit line voltages in the additional program operation of each group, according to a modified embodiment 2 of the embodiment;

FIG. 24 is a table showing the number of executions of the additional program operation and setting of a bit line voltage for a memory cell in each state according to the modified embodiment 2 of the embodiment; and FIG. 25 is a table showing the number of executions of the additional program operation for a memory cell in each state in the case of executing the verify operation for predetermined two states, according to a modified embodiment 3 of the embodiment.

DETAILED DESCRIPTION

One example of a semiconductor memory apparatus that embodies the present embodiment comprises one or more memory cell arrays, a bit line controller, a word line driver, and a control circuit. Commonly, a memory cell array contains a large number of memory cells. One or more word lines are arranged in a row direction, and one or more bit lines are arranged in a column direction across the memory cell array. The memory cells are formed at intersections of the word lines and the bit lines. One end of each of the word lines and bit lines is connected to a word line driver and a bit line controller. Each memory cell is accessible from the word line driver and the bit line controller via a word line and a bit line connected to the memory cell. In the present embodiment, the control circuit controls the word line driver and the bit line controller so that one or more programming states are formed through two programming passes. Such a two-pass programming technique aims at suppressing interference between neighbor word lines. First and second programming passes are often referred to as "foggy" programming and "fine" programming, respectively. The second programming pass (fine programming) is performed after the first programming (foggy programming) of a subsequent adjacent word line and forms smaller threshold voltage distributions than the first programming pass. In the first programming pass, a verify-read operation for each programming state is performed for two verify levels (a verify-low and verify-high levels). The control circuit judges whether the threshold voltage of a cell is lower or higher than the two verify levels, and a programming loop count and a bit line voltage in subsequent programming are determined based on results of the two verify-read operations. The additional programming count and a bit line voltage during the additional programming differ for each programming state. The present invention enables fast programming for the first programming pass.

The embodiment will be described with reference to drawings.

(Configuration of Memory System)

Figure 1:
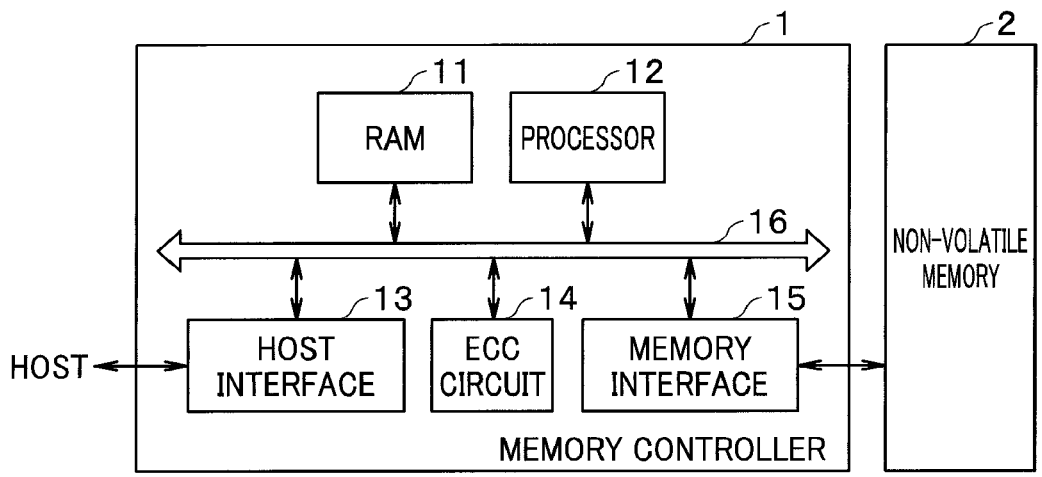
FIG. 1 is a block diagram showing a configuration example of a memory system according to an embodiment.

FIG. 1 is a block diagram showing a configuration example of a memory system according to the embodiment. The memory system of the present embodiment is provided with a memory controller 1 and a non-volatile memory 2. The memory system is connectable to a host. The host is an electronic apparatus, for example, a personal computer or a mobile terminal.

The non-volatile memory 2 is a semiconductor storage apparatus configured to store data in a non-volatile manner and is provided, for example, with a NAND flash memory. In the present embodiment, description will be made on an assumption that the non-volatile memory 2 is a NAND memory including memory cells each of which is capable of storing 4 bit data, that is, a 4 bit/Cell (QLC: Quadruple-Level Cell) NAND memory. The non-volatile memory 2 is three-dimensionalized.

The memory controller 1 controls programming of data to the non-volatile memory 2 according to a programming request from the host. The memory controller 1 also controls reading of data from the non-volatile memory 2 according to a read request from the host. The memory controller 1 is provided with a RAM (random access memory) 11, a processor 12, a host interface 13, an ECC (error check and correct) circuit 14 and a memory interface 15. The RAM 11, the processor 12, the host interface 13, the ECC circuit 14 and the memory interface 15 are mutually connected via an internal bus 16.

The host interface 13 outputs a request received from the host, program data which is user data, and the like to the internal bus 16. The host interface 13 also transmits user data read from the non-volatile memory 2, a response from the processor 12 and the like to the host.

The memory interface 15 controls a process for programming user data and the like to the non-volatile memory 2 and a process for reading out user data and the like from the non-volatile memory 2 based on an instruction from the processor 12.

The processor 12 comprehensively controls the memory controller 1. The processor 12 is, for example, a CPU (central processing unit) or an MPU (micro processing unit). When receiving a request from the host via the host interface 13, the processor 12 performs control according to the request. For example, the processor 12 instructs the memory interface 15 to perform programming of user data and parity to the non-volatile memory 2, according to a request from the host. The processor 12 also instructs the memory interface 15 to read user data and parity from the non-volatile memory 2, according to a request from the host.

The processor 12 decides a storage area on the non-volatile memory 2 (hereinafter referred to as a memory area) for user data accumulated in the RAM 11. The user data is stored into the RAM 11 via the internal bus 16. The processor 12 performs the decision of a memory area for data for each page, which is a programming unit, that is, page data. In the present specification, user data stored in an area corresponding to one page on the non-volatile memory 2 is defined as unit data. The unit data is, for example, encoded and stored into the non-volatile memory 2 as a codeword.

Note that encoding is not essential. Though the memory controller 1 may store unit data into the non-volatile memory 2 without encoding the unit data, FIG. 1 shows a configuration in which encoding is performed, as one configuration example. When the memory controller 1 does not perform encoding, page data corresponds to unit data. One codeword may be generated based on one piece of unit data. One codeword may be generated based on a divided piece of data obtained by dividing unit data. Further, one codeword may be generated using a plurality of pieces of unit data.

The processor 12 decides, for each piece of unit data, a programming-destination memory area on the non-volatile memory 2. Physical addresses are assigned to memory areas on the non-volatile memory 2. The processor 12 manages a programming-destination memory area for unit data using a physical address. The processor 12 instructs the memory interface 15 to program user data to the non-volatile memory 2, specifying a physical address of a decided memory area. The processor 12 manages correspondence between a logical address (a logical address managed by the host) of the user data and the physical address. When receiving a read request including a logical address from the host, the processor 12 identifies a physical address corresponding to the logical address, and instructs the memory interface 15 to read user data, specifying the physical address.

The ECC circuit 14 encodes user data stored in the RAM 11 to generate a codeword. The ECC circuit 14 also decodes a codeword read from the non-volatile memory 2.

The RAM 11 temporarily stores user data received from the host until the user data is stored into the non-volatile memory 2 and temporarily stores data read from the non-volatile memory 2 until the data is transmitted to the host. The RAM 11 is a general-purpose memory, for example, an SRAM (static random access memory) or a DRAM (dynamic random access memory).

FIG. 1 shows a configuration example in which the memory controller 1 is provided with the ECC circuit 14 and the memory interface 15. However, the ECC circuit 14 may be included in the memory interface 15. The ECC circuit 14 may be included in the non-volatile memory 2.

When receiving a programming request from the host, the memory controller 1 operates as below. The processor 12 causes program data to be temporarily stored into the RAM 11. The processor 12 reads out the data stored in the RAM 11 and inputs the data to the ECC circuit 14. The ECC circuit 14 encodes the inputted data and inputs a codeword to the memory interface 15. The memory interface 15 programs the inputted codeword to the non-volatile memory 2.

When receiving a read request from the host, the memory controller 1 operates as below. The memory interface 15 inputs a codeword read from the non-volatile memory 2 to the ECC circuit 14. The ECC circuit 14 decodes the inputted codeword and stores the decoded data into the RAM 11. The processor 12 transmits the data stored in the RAM 11 to the host via the host interface 13.

Figure 2:
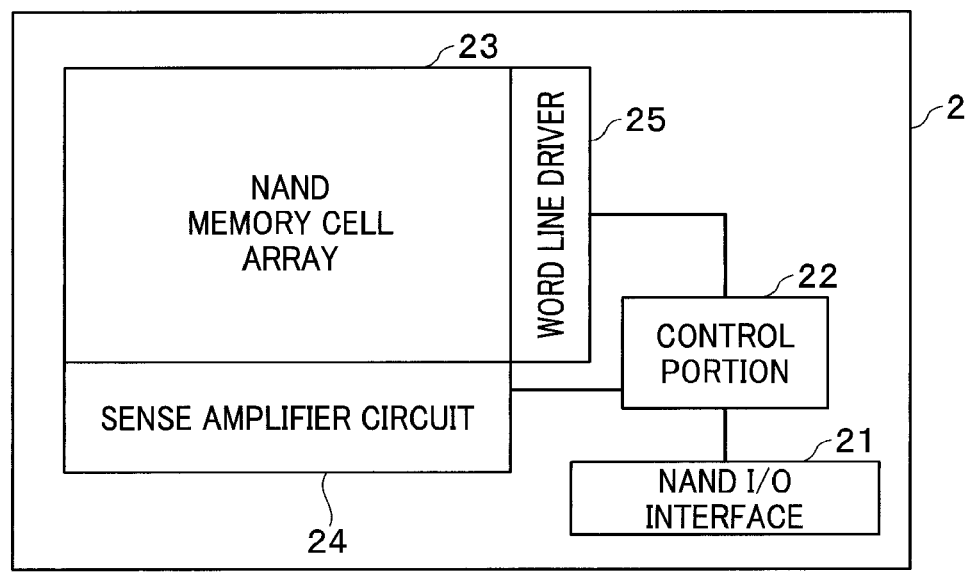
FIG. 2 is a block diagram showing a configuration example of a non-volatile memory of the embodiment.

FIG. 2 is a block diagram showing a configuration example of a non-volatile memory of the present embodiment. The non-volatile memory 2 includes a NAND I/O interface 21, a control portion 22, a NAND memory cell array 23, a sense amplifier circuit 24, and a word line driver 25. The non-volatile memory 2 is configured, for example, with a one-chip semiconductor substrate (for example, a silicon substrate).

The NAND I/O interface 21 receives control signals such as a programming enable signal WEn, a read enable signal REn, an address latch enable signal ALE and a command latch enable signal CLE outputted from the memory controller 1. The NAND I/O interface 21 also receives a command, an address and data outputted from the memory controller 1.

The control portion (control circuit) 22 receives a control signal, a command, an address, and data from the NAND I/O interface 21, and controls an operation of the non-volatile memory 2, based on the received control signal, command, address and data. The control circuit 22 controls, for example, the word line driver 25 and the sense amplifier circuit 24 based on the received control signal, command, address and data to execute a program operation, a read operation, an erase operation or the like.

If a programming command is inputted, the control circuit 22 controls the sense amplifier circuit 24 and the word line driver 25 to program data inputted accompanying the programming command to a specified address on the NAND memory cell array 23. If a read command is inputted, the control circuit 22 controls the sense amplifier circuit 24 and the word line driver 25 to read data from a specified address on the NAND memory cell array 23.

For example, the control circuit 22 controls a voltage applied to a plurality of word lines WL by the word line driver 25 and a voltage applied to a plurality of bit lines BL by the sense amplifier circuit 24 (a bit line voltage) in order to program data to the memory cells (memory cell transistors) MT included in the NAND memory cell array 23.

The sense amplifier circuit 24 is configured to be capable of applying a voltage (or a current) independently to the plurality of bit lines BL and independently detecting a voltage (or a current) of the plurality of bit lines BL.

The word line driver 25 is configured to be capable of applying a voltage independently to a plurality of word lines and select gate lines.

(Configuration of NAND Memory Cell Array)

Figure 3:
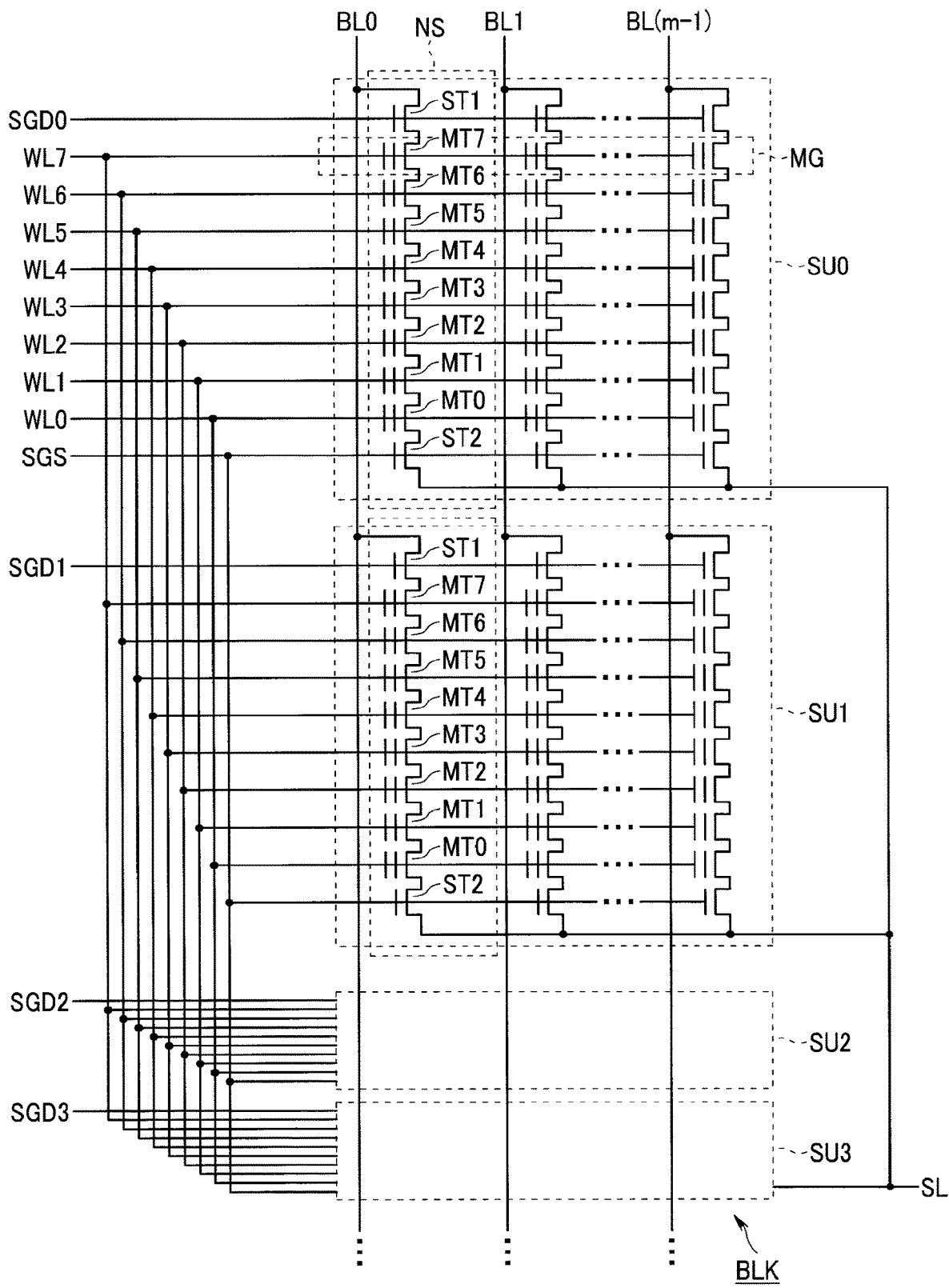
FIG. 3 is a diagram showing a configuration example of a block of a NAND memory cell array in a three-dimensional structure according to the embodiment.

FIG. 3 is a diagram showing a configuration example of a block of the NAND memory cell array 23 in a three-dimensional structure. FIG. 3 shows one block BLK among a plurality of blocks constituting the NAND memory cell array (hereinafter referred to as the memory cell array) 23 in a three-dimensional structure. Each of the other blocks of the memory cell array has a configuration similar to the configuration shown in FIG. 3. Note that the present embodiment is also applicable to a memory cell array in a two-dimensional structure.

As shown in FIG. 3, the block BLK includes, for example, four string units (SU0 to SU3). Each of the string units SU includes a plurality of NAND strings NS. Here, each of the NAND strings NS includes eight memory cells MT (MT0 to MT7) and selects transistors ST1 and ST2. Note that though the number of memory cells MT included in each NAND string NS is eight here, the number is not limited to eight, but, for example, thirty-two, forty-eight, sixty-four and ninety-six are also possible. Each of the select transistors ST1 and ST2 is shown as one transistor when seen as an electrical circuit but may be structurally the same as a memory cell transistor. Further, for example, in order to enhance a cutoff characteristic, a plurality of select transistors may be used as each of the select transistors ST1 and ST2. Furthermore, a dummy cell transistor may be provided between a memory cell MT and each of the select transistors ST1 and ST2.

The memory cells MT are arranged between the select transistors ST1 and ST2 in a manner of being connected in series. A memory cell MT7 on one end side is connected to the select transistor ST1, and a memory cell MT0 on the other end side is connected to the select transistor ST2.

Gates of the select transistors ST1 of the string units SU0 to SU3 are connected to select gate lines SGD0 to SGD3, respectively. On the other hand, the gates of the select transistors ST2 are connected to the same select gate line SGS that is in common among the plurality of string units SU existing in the same block BLK. Gates of memory cells MT0 to MT7 existing in the same block BLK are connected respectively to word lines WL0 to word lines WL7 that are in common in the same block BLK. In other words, while the word lines WL0 to WL7 and the select gate line SGS are in common among the plurality of string units SU0 to SU3 in the same block BLK, each of the select gate lines SGD for the string units SU0 to SU3 is independent even in the same block BLK.

To the gates of the memory cells MT0 to MT7 constituting each NAND string NS, the word lines WL0 to WL7 are connected, respectively. In the block BLK, gates of memory cells MTi existing on the same row are connected to the same word line WLi. Note that a NAND string NS may be referred to simply as "a string" in the description below.

Each NAND string NS is connected to a corresponding bit line. Therefore, each memory cell MT is connected to a bit line via select transistors ST and other memory cells MT included in the NAND string NS. As described above, data of memory cells MT existing in the same block BLK is batch-erased. On the other hand, reading and programming of data are performed for each memory cell group MG (or for each page). In the present specification, a plurality of memory cells MT connected to one word line WLi and belonging to one string unit SU are defined as a memory cell group MG. In the present embodiment, the non-volatile memory 2 is a QLC (quadruple-level cell) NAND memory capable of holding 4-bit (16-value) data. Therefore, one memory cell group MG can hold data corresponding to four pages. The four bits that each memory cell MT can hold correspond to the four pages, respectively.

Figure 4:
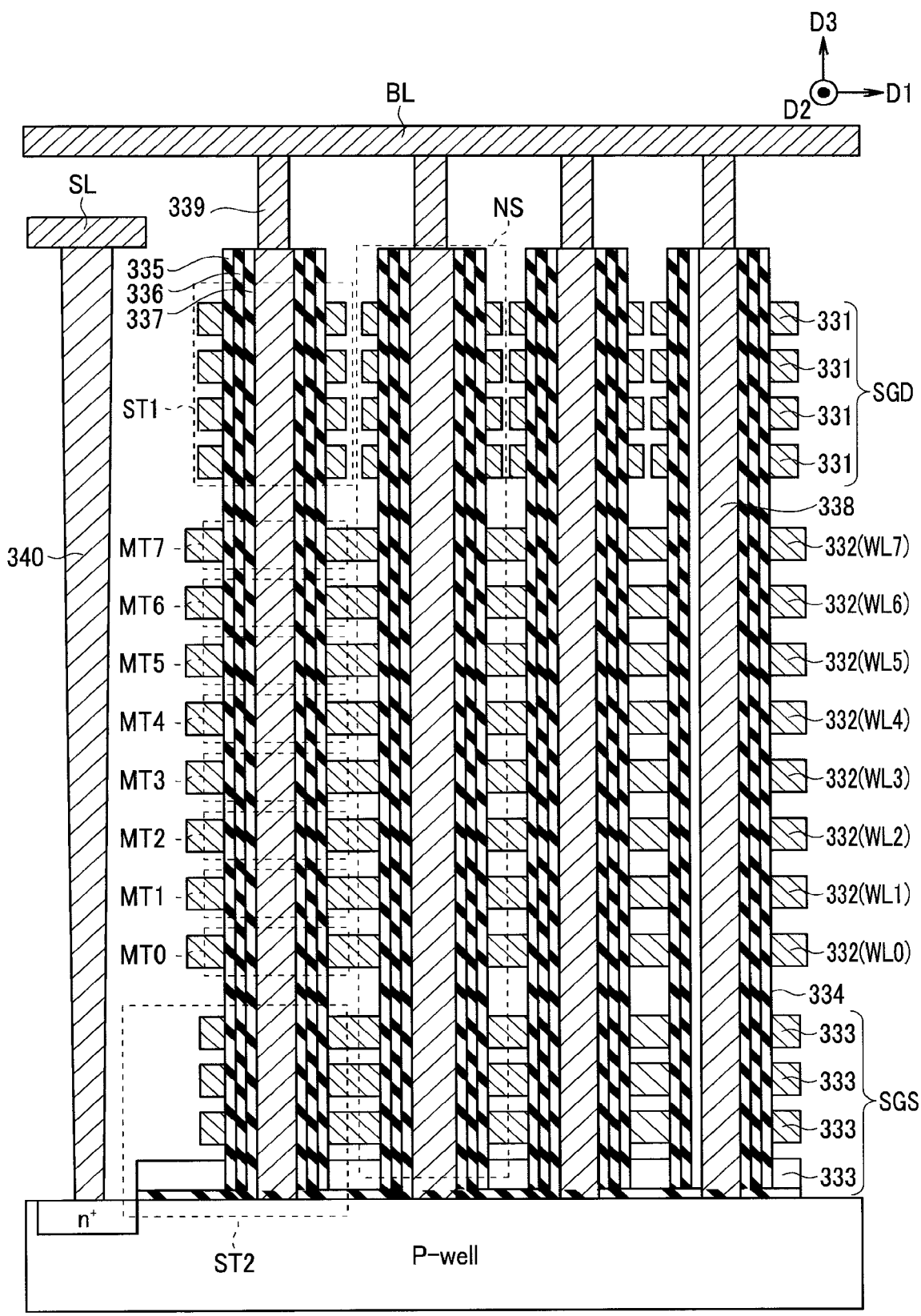
FIG. 4 shows a cross-sectional view of a partial region of the NAND memory cell array in the three-dimensional structure according to the embodiment.

FIG. 4 shows a cross-sectional view of a partial region of a NAND memory cell array in a three-dimensional structure. As shown in FIG. 4, a plurality of NAND strings NS are formed on a p-well region. In other words, on the p-well region, a plurality of wiring layers 333 configured to function as select gate lines SGS, a plurality of wiring layers 332 configured to function as the word lines WLi and a plurality of wiring layers 331 configured to function as select gate lines SGD are laminated.

Memory holes 334 that reach the p-well region through the wiring layers 333, 332 and 331 are formed. On side faces of each memory hole 334, a block insulating film 335, a charge-trapping film (a charge holding region) 336 and a gate insulating film 337 are sequentially formed. Furthermore, a conductor post 338 is embedded in the memory hole 334. The conductor post 338 is made, for example, of polysilicon and functions as a region where a channel is formed when the memory cells MT and the select transistors ST1 and ST2 included in the NAND string NS operate. In other words, each of the wiring layer 331, the conductor post 338, and the films 335 to 337 between the wiring layer 331 and the conductor post 338 functions as the select transistor ST1. Each of the wiring layer 332, the conductor post 338, and the films 335 to 337 between the wiring layer 332 and the conductor post 338 functions as a memory cell MT. Each of the wiring layer 333, the conductor post 338, and the films 335 to 337 between the wiring layer 333 and the conductor post 338 functions as the select transistor ST2.

In each NAND string NS, the select transistor ST2, the plurality of memory cells MT and the select transistor ST1 are sequentially formed on the p-well region. On an upper side of the conductor post 338, a wiring layer configured to function as a bit line BL is formed. On an upper end of the conductor post 338, a contact plug 339 connecting the conductor post 338 and the bit line BL is formed.

Furthermore, an n+ type impurity diffusion layer and a p+ type impurity diffusion layer are formed within a surface of the p-well region. A contact plug 340 is formed on the n+ type impurity diffusion layer, and a wiring layer configured to function as a source line SL is formed on the contact plug 340.

A plurality of configurations, each of which is the configuration described above and shown in FIG. 4, are arrayed in a depth direction of FIG. 4, and one string unit SU is formed by a set of a plurality of NAND strings arranged in line in the depth direction.

Figure 5:
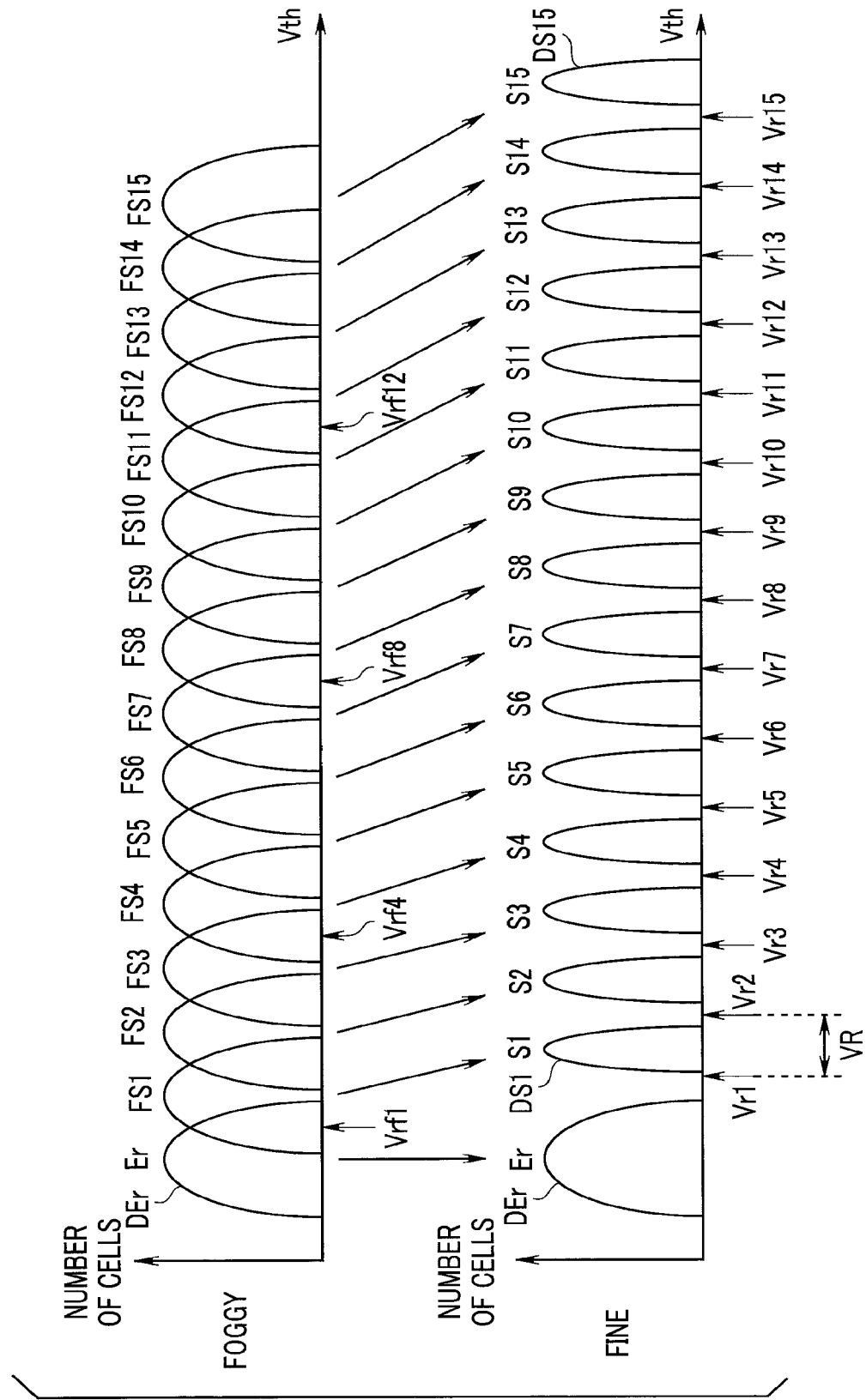
FIG. 5 is a diagram showing an example of threshold voltage regions according to the embodiment.

FIG. 5 shows an example of threshold voltage (Vth) distributions provided by the present embodiment. The non-volatile memory 2 with four bits per cell (quadruple-level cell; QLC) is assumed in FIG. 5. A threshold voltage Vth of each memory cell MT depends on an electric charge amount stored in a charge-trapping layer in the non-volatile memory 2. Data storage is achieved by utilizing dependency of Vth on the electric charge amount stored in the charge-trapping layer. Each of one or more data bits is associated with one Vth region. For example, in the case of QLC, 4-bit data are associated with 16 ($=2^4$) Vth regions.

Sixteen mountain-shaped distributions Er, and DS1 to DS15 in FIG. 5 depict Vth distributions of sixteen Vth regions of a QLC-type non-volatile memory. The horizontal axis in FIG. 5 indicates Vth, and the vertical axis in FIG. 5 indicates the number of memory cells. An upper part of FIG. 5 shows sixteen Vth distributions after "foggy" programming. The "foggy" programming is a first programming pass of a "foggy and fine programming" technique, which includes two programming passes "foggy" and "fine" (to be described later). A lower part of FIG. 5 shows sixteen Vth distributions in a final state after the "fine" programming. Since almost all elements that influence Vth of memory cells, such as a gate length, a channel width, a tunnel oxide thickness, positions and the number of grain boundaries of polysilicon channels, positions of implanted impurity atoms and the number of electrons injected into the charge-trapping layer, are determined through stochastic processes, there is statistical variation among threshold voltages of memory cells. In the present embodiment, memory cells MT have Vth distributions separated by fifteen region boundaries, that is, fifteen verify levels.

In the present embodiment, Vth regions under Vr1, between Vr1 and Vr2, between Vr2 and Vr3, and between Vr3 and Vr4 after fine programming are defined as Er, S1, S2, and S3 states, respectively. Similarly, S4 to S15 states are also defined as corresponding Vth regions after fine programming as shown in FIG. 5. The term "state" refers to a threshold voltage level. The voltages Vr1 to Vr15 satisfy a relationship of Vr1<Vr2<Vr3<Vr4<Vr5<Vr6<Vr7<Vr8<Vr9<Vr10<Vr11<Vr12<Vr13<Vr14<Vr15.

Hereinafter, Vth distributions corresponding to the states Er, and S1 to S15 are defined as DEr, and DS1 to DS15. DEr is also referred to as "a first distribution", and DS1 to DS15 are also referred to as "second to fifteenth distributions". The voltages Vr1 to Vr15 are reference voltages separating threshold voltage regions.

Here, Vrf1 to Vrf15 shown in the upper part of FIG. 5 indicate threshold voltages after foggy programming, and Vrf1 to Vrf15 correspond to foggy programming states DS1 to DS15.

Memory cells MT to be finally programmed up to the S1 state during the fine programming are programmed up to the FS1 state during the preceding foggy programming. Memory cells MT to be finally programmed up to the S2 state during the fine programming are programmed up to the FS2 state during the preceding foggy programming. Similarly, memory cells MT to be finally programmed up to the S3 to S15 states during the fine programming are programmed respectively to the FS3 to FS15 states during the preceding foggy programming.

Here, VR indicates a threshold voltage difference between two consecutive programming states. In other words, the threshold voltage difference between centers of two consecutive distributions is as much as VR. In the present embodiment, the voltage differences VR do not have to be strictly equal among states, although all the programming states Er to S15 are distributed at almost the same intervals.

In the non-volatile memory 2, each memory cell has two or more programming states, and each programming state is associated with one or more bit data. Correspondence relationship between programming states and bit data is referred to as "data coding". At the time of programming, the programming state for each memory cell is determined by comparing data to be programmed and predefined data coding, and an electric charge is injected into the memory cell so that Vth of the cell is included in a Vth region of the corresponding programming state.

FIG. 6 shows data coding of the present embodiment. In the present embodiment, sixteen Vth distributions shown in FIG. 5 are respectively associated with sixteen data values of 4-bit data. For example, the memory cells in the Vth distribution DEr store 4-bit "1111" data. The digits of the 4-bit data belong to higher, upper, middle, and lower logical pages, respectively. Similarly, the memory cells in the Vth distribution DS1 store 4-bit "1011" data according to FIG. 6.

Thus, each Vth region, or each distribution DS can express 4-bit data of each memory cell. The threshold voltages of non-programmed (or erased) memory cells are included in the DEr distribution region. The data coding shown in FIG. 6 is a kind of Gray code, where 4-bit-data of any programming states differs only in one bit from neighboring programming states. For example, the 4-bit "1111" data associated with DEr and the 4-bit "1011" data associated with adjacent DS1 are different only in that the upper page bit is "0" or "1".

(Data Write Operation)

A data write operation is configured mainly with program operation and verify operation.

The program operation is an operation of raising Vth of memory cells by injecting electrons into the charge-trapping layer of the memory cells. A Vth-raising operation is defined as "0"-programming or "0"-writing in the description below. Bit lines of programming targets are set to "0" data. The Vth-non-raising operation is defined as "1"-programming, "1"-writing, or "program-inhibited" in the description below. A program-inhibited bit line is set to "1" data.

The verify operation is an operation of, by reading out data of each memory cell immediately after the above program operation is performed, judging whether Vth of each memory cell, that is, each memory transistor has reached a target level. If Vth of the memory cell has reached the target level, programming to the memory cell is inhibited in subsequent write operations.

By iterating the program and verify operations described above, Vth of the memory cells are raised to their target levels.

Figure 7:
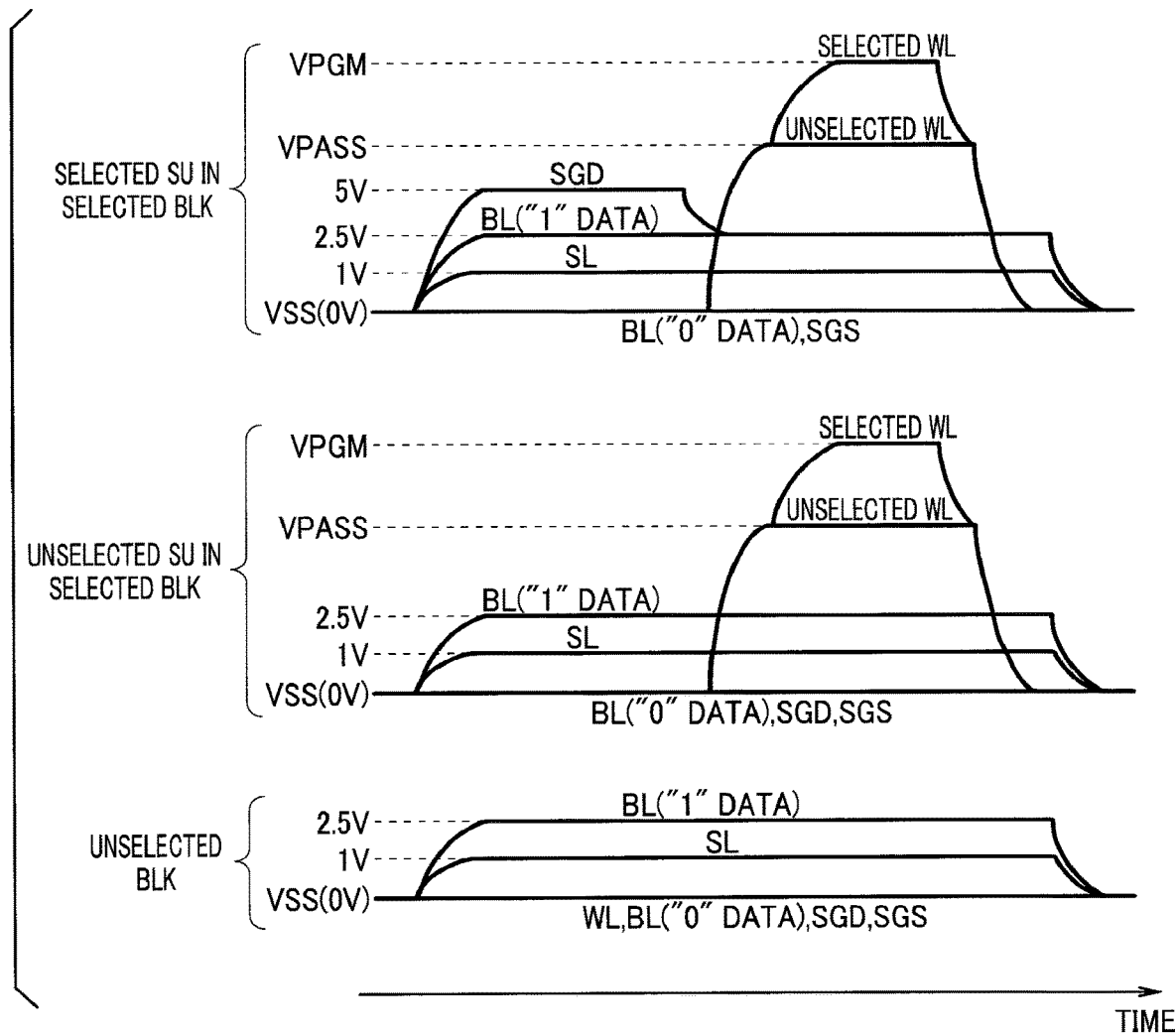
FIG. 7 is a diagram showing change in electric potential of each wiring during a program operation according to the embodiment.

FIG. 7 shows an example of time evolution of voltages of various line electrodes during the program operation. As shown in FIG. 7, the sense amplifier circuit 24 first transfers program data to each bit line BL. To a bit line BL to which "0" data has been given, a ground voltage Vss (for example, 0 V) is applied as an "L" level. To a bit line BL to which "1" data has been given, a program-inhibited voltage Vinhibit (for example, 2.5 V) is applied as an "H" level.

The word line driver 25 selects one block BLK and one string unit SU in the block BLK, and applies, for example, 5 V to a select gate line SGD in the selected string unit SU. The select transistor ST1 is turned on. The word line driver 25 applies the voltage Vss to the select gate line SGS. The Select transistor ST2 is turned off.

Furthermore, the word line driver 25 applies the voltage Vss to the select gate lines SGD and the select gate line SGS in the unselected string units SU in the selected block BLK and to the select gate lines SGD and the SGSs in unselected string units SU in unselected blocks BLK. The select transistors ST1 and ST2 in the unselected string units are turned off.

The source line SL is fixed, for example, to 1 V (electric potential higher than electric potential of the select gate lines SGS).

After that, the word line driver 25 fixes the electric potential of the select gate line SGD in the selected string unit SU in the selected block BLK to 2.5 V, for example. The electric potential causes the select transistor ST1 on the bit line BL of "0" data (0 V) to be turned on but causes the select transistor ST1 on the bit line BL of "1" data (2.5 V) to be cut off.

Figure 8:
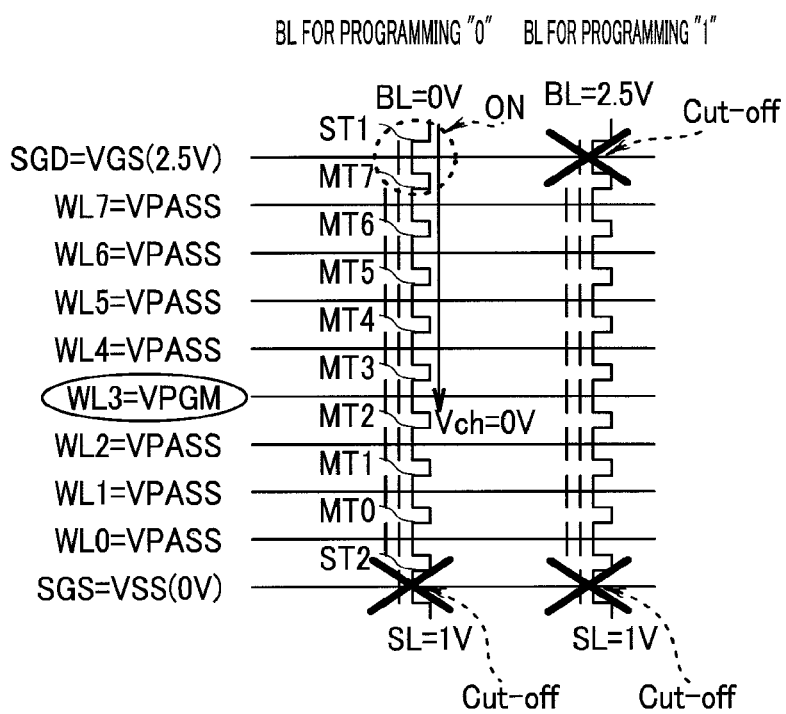
FIG. 8 is a circuit diagram showing a state of a string during the program operation according to the embodiment.

Then, the word line driver 25 selects one word line WL in the selected block BLK, applies voltage Vpgm to the selected word line, and applies voltage Vpass_pgm to other unselected word lines WL. The voltage Vpgm is a high voltage for injecting electrons to the charge-trapping film by a tunnel phenomenon (Vpgm>Vpass_pgm). FIG. 8 is a circuit diagram showing a state of a string unit SU while Vpgm is applied.

FIG. 8 shows two NAND strings corresponding to a bit line BL targeted by "0"-programming and a bit line BL targeted by "1"-programming. In FIG. 8, a word line WL3 is selected.

As shown in FIG. 8, the voltage Vpgm is applied to the selected word line WL3, and the voltage Vpass_pgm is applied to unselected word lines WL0 to WL2, and WL4 to WL7.

On the NAND string connected to the bit line BL to which "0" data is specified, the select transistor ST1 is turned on. Since Vss is transferred to a memory cell MT3 connected to the selected word line WL3, channel electric potential Vch becomes 0 V. A large electric potential difference is caused between the gate and the channel. As a result, electrons are injected into the charge-trapping film, and the threshold voltage of the memory cell MT3 is raised.

On the NAND string connected to the bit line BL to which "1" data is specified, the select transistor ST1 is cut off. Since both ends of the channel are insulated, the channel is electrically floating near the memory cell MT3 connected to the selected word line WL3. Due to capacitive coupling with the word line WL and the like, the channel electric potential Vch is raised to be close to the voltage Vpass_pgm. Therefore, the electric potential difference between the gate and the channel decreases. As a result, electrons are not injected into the charge-trapping film, and the threshold voltage of the memory cell MT3 is almost maintained. The threshold voltage distribution does not shift higher.

A "quick pass write (QPW)" programming technique is often adopted.

Figure 9:
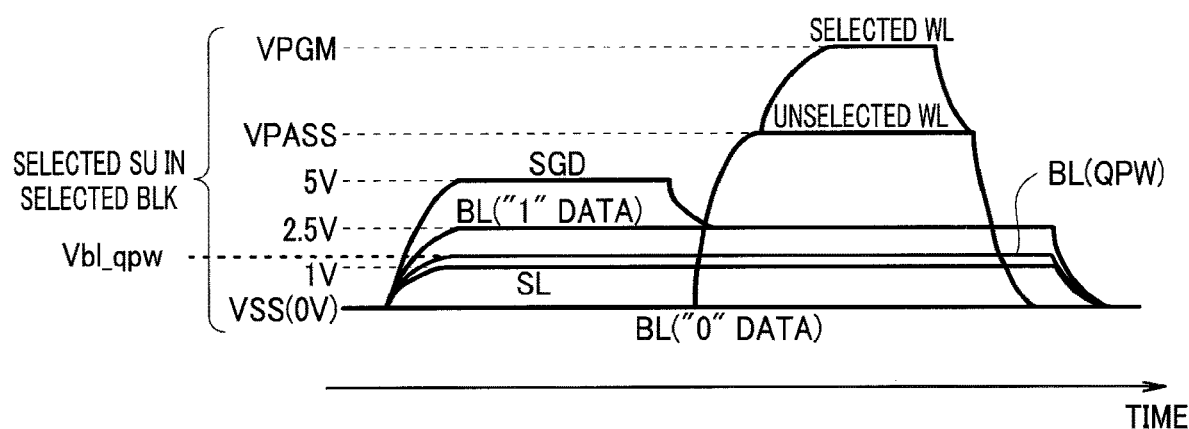
FIG. 9 is a diagram showing change in electric potential of each wiring during a QPW operation according to the embodiment.

As shown in FIG. 7, an "L"-level voltage (Vss or 0 V) is applied to the bit lines BL connected to the memory cells to be raised to a higher Vth (or to which "0"-data is to be programmed). The bit lines BL, which are connected to the memory cells kept staying around the present Vth (or "1"-data is to be programmed), are biased to an "H"-level voltage (for example, 2.5 V). In such a case, an option to control Vth of the cells is either to raise Vth by as much as the step-up width of programming voltage or to keep Vth to the present value. In addition, the QPW programming technique provides a third option of "slightly" raising Vth of memory cells. FIG. 9 depicts time evolution of electric potential of various electrodes based on the QPW programming technique.

In the QPW programming technique, the bit lines BL, which are connected to the memory cells to be raised to a slightly higher Vth, are biased to an intermediate voltage between the "L"-level and "H"-level voltages as shown in FIG. 9. The channel potential Vch of the target cell of QPW programming is raised to a potential higher than "L"-level (Vss or 0 V). The raised bit line potential causes the programming voltage between the channel and the word line to decrease, and thereby, injection of electrons into the charge-trapping layer is weakened, which lowers the Vth rise speed. Therefore, in controlling Vth of memory cells, three options are available, that is, fully raising Vth, keeping Vth, and slightly raising Vth. The bit line voltage for performing the QPW operation, which is the third option, will be hereinafter referred to as a "QPW voltage Vbl_qpw".

A verify-read operation is an operation to judge whether or not memory cells have been sufficiently programmed, and the threshold voltages of the memory cells have reached their verify levels. The verify-read operation is performed as a part of a write operation. Reading is tested, and a result of the test is compared with data to be programmed.

Figure 10:
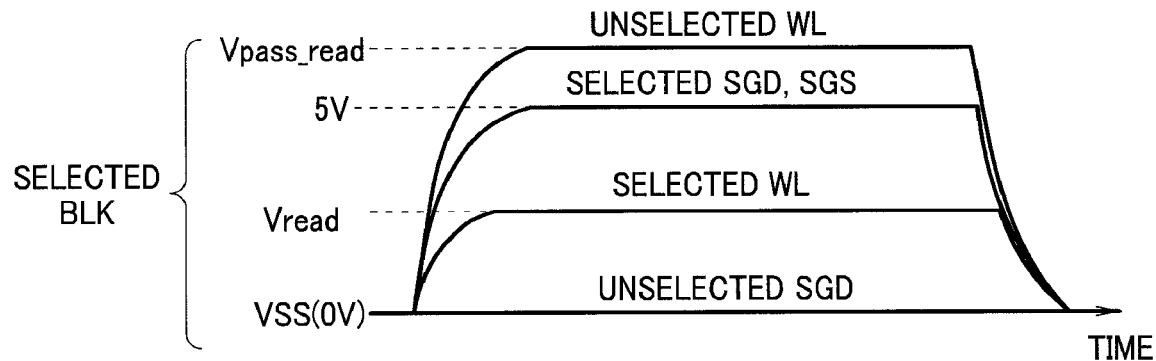
FIG. 10 is a diagram showing change in electric potential of each wiring during a verify operation according to the embodiment.

FIG. 10 shows time evolution of electric potential of various electrodes during a verify-read operation. The word line driver 25 selects a block BLK and a string unit SU for which a program operation has been performed, and applies, for example, 5 V to the select gate line SGS in the selected block BLK and the select gate line SGD in the selected string unit SU. In NAND strings included in the selected string unit SU, both of select transistors ST1 and select transistors ST2 are turned on.

The word line driver 25 applies the voltage Vss to the select gate lines SGS in the unselected blocks BLK and to the select gate lines SGD in the unselected string units SU in the selected block BLK. The select transistors ST1 and/or ST2 are turned off. Therefore, in the NAND strings included in the unselected string units SU, at least the select transistors ST1 are turned off. On the other hand, in the NAND strings included in the unselected blocks BLK, both of the select transistors ST1 and select transistors ST2 are turned off.

Then, the word line driver 25 selects one word line WL in the selected block BLK, applies a voltage Vread to the selected word line, and applies a voltage Vpass_read to other unselected word lines WL. For example, when memory cells MT are to be programmed up to the state S1, the voltage Vr1 is used as the voltage Vread in verify operations for the memory cells MT. Similarly, when memory cells MT are to be programmed up to the state S2, the voltage Vr2 is used as the voltage Vread in verify operations for the memory cells MT. The voltage Vpass_read has to turn on memory cells MT connected to the unselected word lines WL irrespective of threshold voltages of the memory cells MT. A relationship of Vpass_read>Vread (Vr15) is required.

After that, the sense amplifier circuit 24 raises the voltage of each bit line BL to a voltage Vbl. The voltage Vbl is larger than the voltage Vsl of the source line (Vbl>Vsl). If the threshold voltages of the memory cells MT connected to the selected word line are lower than Vread, a current flows from the bit line BL side to the source line SL side in the NAND strings included in the selected string unit SU. Otherwise, a current does not flow. Thus, the control circuit 22 and the sense amplifier circuit 24 can verify whether the threshold voltage has been raised to a predefined level or not.

Figure 11:
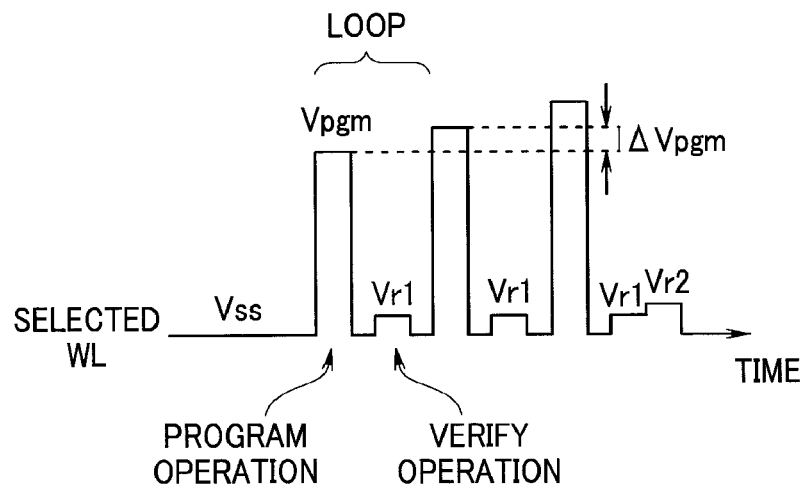
FIG. 11 is a diagram for illustrating a data write operation according to the embodiment.

Data write operation is executed by iterating a loop including program operation and verify operation. As shown in FIG. 11, the programming voltage Vpgm is applied to the selected word line WL in the program operation. In the subsequent verify operation, at least one of the voltages Vr1 to Vr15 is applied to the selected word line according to a threshold voltage level to be verified. In one programming loop, one or more verify operations are often executed after a program operation. On the other hand, there may be a case where a verify operation is not executed after a program operation in one programming loop.

(Two-Pass Programming Technique)

The non-volatile semiconductor memory 2 uses two-pass programming technique in the present embodiment. In the two-pass programming technique, after a selected block is erased, program data on a selected word line is roughly programmed through the first programming pass. After the first or second programming pass is executed on an adjacent word line, the second programming pass is executed in turn on the selected word line. Such a back-and-forth two-pass programming technique is often referred to as a "foggy and fine" programming technique.

The control circuit 22 controls the programming voltage and the bit line voltages so as to achieve the two-pass foggy and fine programming. In the first programming pass (a "foggy" stage), fifteen threshold voltage distributions (or programming states) FS1 to FS15 are formed through step-up programming on memory cells on a selected word line as shown in the upper part of FIG. 5. In the second programming pass (a "fine" stage), which is performed after the first programming pass, Vth distributions (or programming states) S1 to S15 as shown in the lower part of FIG. 5 are formed through the step-up programming performed again on the same word line.

Figure 12:
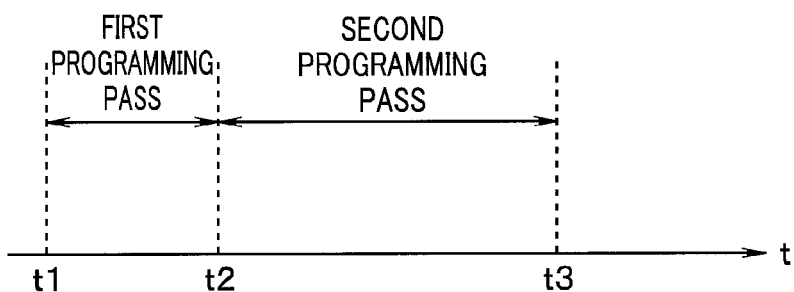
FIG. 12 is a diagram schematically showing a programming sequence for one word line according to the embodiment.

FIG. 12 schematically shows time sequence of programming on one word line. The first programming pass starts at time t1, the second programming pass starts at time t2 after the first programming pass ends, and the second programming pass ends at time t3.

Hereinafter, the first programming pass is referred to as "foggy programming" or "foggy programming pass", and the second programming pass is referred to as "fine programming" or "fine programming pass".

As described above, the foggy and fine programming is executed back and forth across adjacent word lines. The purpose of the back-and-forth programming is to reduce influence of neighbor word line interference. The order of programming passes across word lines and string units is as follows. The foggy programming is executed on string units SUj (j=0 to 3) of a word line k, the fine programming is executed on string units SUj (j=0 to 3) of a word line (k−1), the foggy programming is executed on string units SUj (j=0 to 3) of a word line (k+1), and then the fine programming is executed on string units SUj (j=0 to 3) of the word line k. Here, j is an integer between 0 and 3, including both 0 and 3, that indicates a string unit index, and k is an integer between 0 and 7, including both 0 and 7, that indicates a word line index. Programming passes on adjacent word lines and other string units are hidden from the time sequence in FIG. 12. Actually, however, programming passes on adjacent word lines and other string units are inserted between the foggy and fine programming passes (t2) on the selected word line.

FIG. 13 shows an example of the order of programming passes across word lines and string units. For example, the first programming pass is executed on a memory cell group MG on a word line WL0 as the first to fourth programming passes. The first programming pass on a memory cell group MG on a word line WL1 follows as the fifth to eighth programming passes. The second programming pass on the memory cell group MG on the word line WL0 follows as the ninth to twelfth programming passes. Subsequent programming passes are executed in the same order. The programming on the memory cell group MG of the string unit 0 and the word line WL0 ends when the ninth programming pass ends.

It should be noted that the order of programming across the word lines and the string units can also be defined as follows. The foggy programming on a string unit 0 of the word line k, the fine programming on a string unit 0 of the word line (k−1), the foggy and fine programming on the string units 1 to 3 of the word lines k and (k−1) in the same order as the order for the string unit 0 of the word lines k and (k−1), the foggy programming on a string unit 0 of the word line (k+1), and the fine programming on the string unit 0 of the word line k.

(First Programming Pass: Foggy Programming Pass)

A programming sequence in the foggy programming pass includes one or more iterating voltage pulse sets. The unit of the iterating voltage pulse set is referred to as a programming loop. One of voltage pulses forming the programming loop is the programming voltage Vpgm. The programming voltage Vpgm is applied to a word line to be programmed and causes the threshold voltages Vth of memory cells connected to the word line to rise. The word line to be programmed will be hereinafter referred to as a "selected" word line.

Though the present embodiment is based on a foggy program operation in which verify operations are performed for a smaller number of verify levels than the number of final programming states generated after the fine programming, the same number of Vth distributions as the number of final programming states are generated through the foggy programming pass. The verify levels are shared among several programming states. In other words, it is possible to use one verify level as a reference voltage for two or more programming states. Vth of all memory cells that are being programmed are compared with one of the verify levels for each programming loop.

However, the programming to memory cells is not completed immediately after the verify level is exceeded, depending on programming states, and the loop count (hereinafter, also referred to as the number of loops) in the subsequent additional program operations differs according to the programming states of the memory cells. Thus, the foggy program operation can generate a larger number of Vth distributions than the number of verify levels. Such a programming technique is sometimes referred to as "reduced verify" programming. The reduced verify programming enables high-speed programming because the required number of verify operations per loop is smaller in comparison with the conventional programming in which verify levels are not shared among programming states.

The present embodiment improves the programming speed more than the reduced verify programming known as described above by sharing two verify levels (a verify-high and a verify-low) among a plurality of programming states. In the embodiment described here, the foggy program operation contains only two verify operations per programming loop. The two verify levels of FS1 located around the lower tail of the state FS1 are shared among all the programming states FS1 to FS15. Nevertheless, sixteen programming states are formed through the foggy programming pass. All memory cells to be programmed to the state FS1 to FS15 are judged only about whether the threshold voltages of the memory cells have exceeded the two verify levels of the state FS1.

The present embodiment deals with the improved reduced verify programming accompanied by two verify operations per programming loop, using the two verify levels of FS1. However, another example is also possible in which, for example, four verify levels (two FS1 verify levels and two FS8 verify levels) per programming loop are executed. In this case, memory cells to be programmed to FS1 to FS7 share the two FS1 verify levels, and memory cells to be programmed to FS8 to FS15 share the two FS8 verify levels.

Programming states of memory cells are decided by referring to program data, and electric charges are injected into the memory cells according to the programming states.

In the present embodiment, the programming states are classified into three groups (groups I, II, and III). Each of all the programming states belongs to any one of the three groups.

Memory cells MT to be programmed up to the state FS1 belong to the group-I. For the memory cells of the state FS1, verify operations are executed using two verify levels Vrf1 and Vrf1low. Here, Vrf1low is lower than Vrf1, and Vrf1 is a verify-high level, while Vrf1low is a verify-low level.

Memory cells MT to be programmed up to the state FS3, FS5, FS7, FS9, FS11, FS13 or FS15 belong to the group-II. Memory cells MT to be programmed up to the state FS2, FS4, FS6, FS8, FS10, FS12 or FS14 belong to the group-III. In the foggy programming, a verify operation is not performed for verify levels around the lower tails of the programming states of the group-II and group-III (FS2 to FS15). This is because the programming states share the verify levels with the state FS1.

The programming states belonging to the group-II, that is, FS3, FS5, FS7, FS9, FS11, FS13 and FS15 are even-numbered states when counted from the state FS1 of the group-I. The programming states belonging to the group-III, that is, FS2, FS4, FS6, FS8, FS10, FS12 and FS14 are odd-numbered states when counted from state FS1 of the group-I.

The following is a detailed description of programming to the memory cells MT to be programmed up to FS1 to FS15.

The foggy programming is executed based on page data to be programmed to memory cells including a selected memory cell MT.

(1) Program Operation for Group-I Memory Cells

After a block is erased, the selected memory cell is judged for each programming loop about whether the threshold voltage has exceeded the verify-high level Vrf1, the threshold voltage is between the verify-low level Vrf1low and the verify-high level Vrf1, or the threshold voltage is still below the verify-low level. The verify-high level Vrf1 is nothing but Vrf1 shown in the threshold voltage distribution, which is a threshold for the foggy programming pass in FIG. 5.

If a group-I memory cell MT has passed the verify-low level Vrf1low but failed in the verify-high level Vrf1, in other words, if the threshold voltage Vth of the group-I memory cell is between the verify-low level Vrf1 low and the verify-high level Vrf1, then a quick pass write (QPW) voltage Vbl_qpw is applied to a bit line BL connected to the memory cell MT from the next programming loop, and the memory cell MT is program-inhibited after the next programming loop.

The purpose of the QPW voltage applied to the bit line BL is to reduce the loop-to-loop step-up width of the threshold voltage and prevent the memory cell MT from being over-programmed. Since the memory cell MT has already passed the verify-low level Vrf1low, the memory cell MT is expected to pass the verify-high level Vrf1 in the next programming loop.

In the present embodiment, application of the QPW voltage to the group-I memory cell MT is performed only in one programming loop. This is because the memory cell MT is program-inhibited in the next programming loop. However, the QPW voltage Vbl_qpw can be applied until it is definitely confirmed that the threshold voltage has exceeded the verify-high level, by performing verify operations. In such a case, depending on the results of the verify operations, the QPW voltage can be applied in two or more programming loops after the threshold voltage of the memory cell has exceeded the verify-low level Vrf1low.

If the group-I memory cell MT has passed the verify-high level Vrf1, in other words, if the threshold voltage Vth of the group-I memory cell MT has exceeded the verify-high level Vrf1, the memory cell MT is program-inhibited in the next programming loops.

Figure 14:
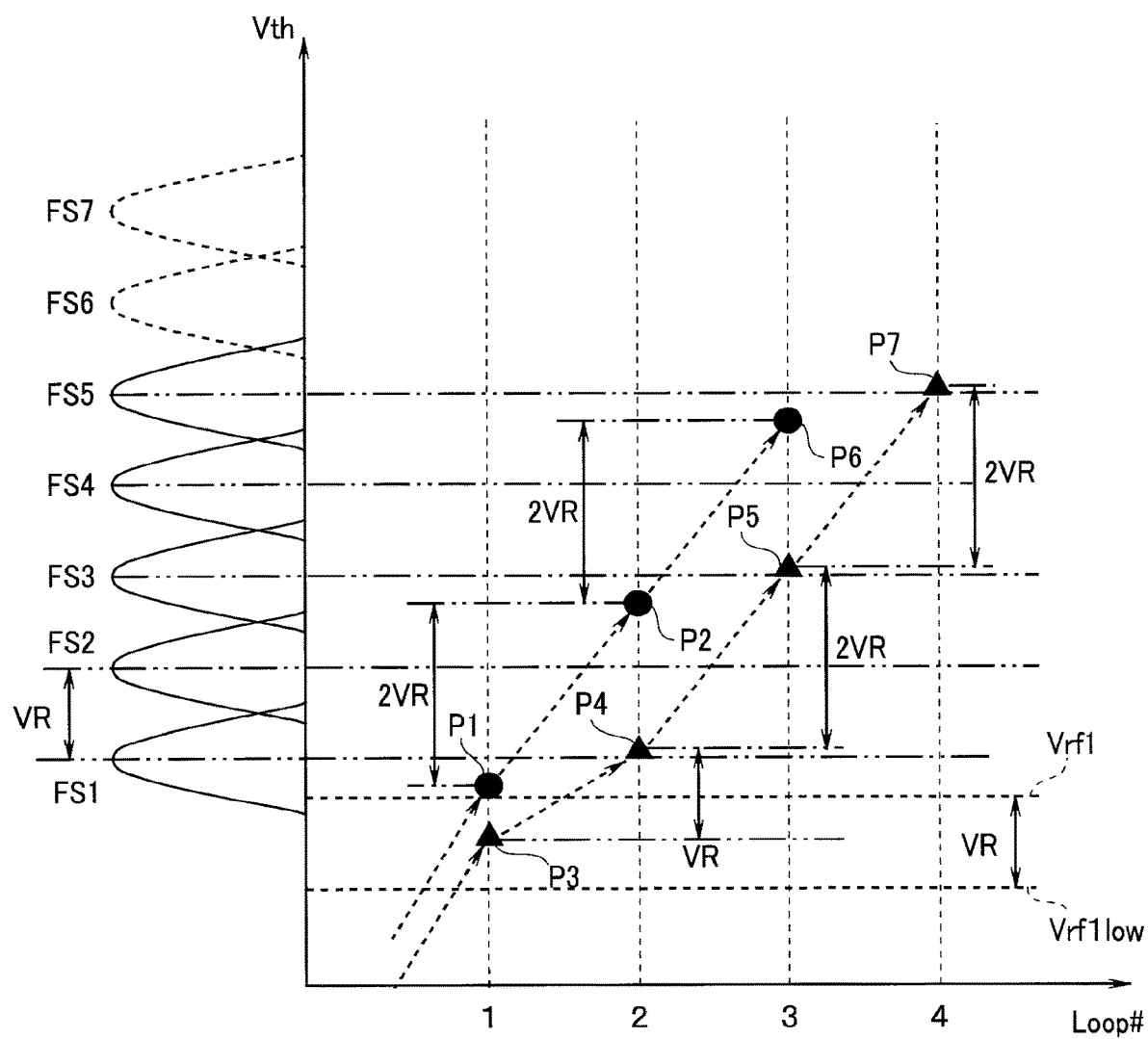
FIG. 14 is a diagram for illustrating a relationship between a loop count and a threshold voltage Vth of a selected memory cell in the first programming pass according to the embodiment.

The foggy program operation will be described in detail below using FIG. 14, which schematically depicts a part of programming loop dependency of the selected memory cell MT during the foggy programming pass. In FIG. 14, the horizontal axis indicates the programming loop, and the vertical axis indicates the threshold voltages Vth of the memory cells MT. Two polygonal lines depicted in FIG. 14 are examples of change in the threshold voltages.

The threshold voltage distributions drawn on the left side of FIG. 14 have broader widths than the threshold voltage distributions (DS) in the lower part of FIG. 5. The threshold voltage distributions of the programming states FS1 to FS5 are drawn in FIG. 14.

In FIG. 14, Vrf1 and Vrf1low are the verify-high and verify-low levels of the state FS1, respectively, and Vrf1 low is lower than Vrf1. The difference between Vrf1 low and Vrf1 is set to be almost equal to VR, which is the difference between the lower-tail threshold voltages of the two consecutive programming states shown in the lower part of FIG. 5. In the case of VR>Vrf1, the value of Vrf1low (=Vrf1-VR) can be a negative value or a value lower than Vss. Such an operation can be achieved by providing a negative word line voltage from the word line driver 25. Another solution to detect a negative threshold voltage is to choose a certain operation parameter, such as sensing duration for the verify-low operation different from sensing duration for the verify-high operation, while applying the word line voltage Vrf1 during the verify-low operation that is equal to the word line voltage Vrf1 during the verify-high operation. Such an operation can give the same effect as negative threshold voltage sensing, even if a positive word line voltage is being applied during the verify-low operation.

Before the foggy programming, a block erase operation is performed. Therefore, when the foggy programming starts, all memory cells in a block BLK are in the erased state Er which is the lowest state among the logical data, and the threshold voltages of almost all the memory cells have negative values. After the erase operation, the control circuit 22 applies the programming voltage Vpgm to a word line selected to write data (hereinafter referred to simply as "a selected word line").

A circular point P1 in FIG. 14 indicates the threshold voltage Vth of a memory cell MT that has directly exceeded the verify-high level Vrf1 beyond the verify-low level Vrf1low. The threshold voltage is below the verify-low level Vrf1low before Loop #1 but exceeds the verify-high level Vrf1 after execution of Loop #1. If memory cells to be programmed up to the state FS1 have the threshold voltage indicated as P1, the memory cells MT are program-inhibited in the next programming loop.

The triangular point P3 in FIG. 14 indicates the threshold voltage of a memory cell that has exceeded the verify-low level Vrf1low but is still below the verify-high level Vrf1. If memory cells to be programmed up to the state FS1 have the threshold voltage indicated as P3, the memory cells MT are programmed with the programming voltage Vpgm and the bit line voltage of Vbl_qpw once in the next programming loop, and the memory cells MT are program-inhibited in all the subsequent programming loops.

The control circuit 22 does not perform verify operations for the group-I memory cells that have passed the verify operations with the verify levels of Vrf1 and Vrf1low, in the subsequent programming loops.

(2) Program Operation for Group-II Memory Cells (FS3, FS5, FS7, FS9, FS11, FS13 and FS15)

A step-up width ΔVpgm of the programming voltage Vpgm of the foggy programming pass is adjusted so that the loop-by-loop step-up width ΔVth of the threshold voltage Vth of a selected memory cell becomes almost as twice as the verify-level interval VR of the fine programming pass (ΔVth=2VR). Group-II memory cells MT, the threshold voltages of which have directly reached the verify-high level Vrf1 beyond the verify-low level Vrf1low, are additionally programmed under the ground voltage Vss applied to the corresponding bit lines and with the above-mentioned step-up width ΔVpgm from the next loop. The additional programming count is predefined depending on the programming state.

On the other hand, group-II memory cells MT, the threshold voltages of which have reached the verify-low level Vrf1low but have not reached the verify-high level Vrf1, are additionally programmed under the QPW voltage Vbl_qpw applied to the corresponding bit lines BL and the programming voltage Vpgm with the above-mentioned step-up width ΔVpgm from the next programming loop. The additional programming loop count (also referred to as the number of additional programming loops) is predefined for each programming state separately from the above-mentioned case in which the threshold voltages of the memory cells directly reach the verify-high level. By the QPW voltage Vbl_qpw being applied to the bit line during programming, the QPW voltage is transferred from the bit line BL to the channel of the memory cell MT, and thereby, the programming voltage between the channel and the word line of the target memory cell is reduced from Vpgm-Vss to Vpgm-Vbl_qpw (Vbl_qpw>Vss). Therefore, by choosing Vbl_qpw almost equal to VR, an effective step-up width of the programming voltage Vpgm for the memory cells under Vbl_qpw is also reduced from ΔVth=2VR to ΔVth=VR in the first programming loop applying Vbl_qpw. In the subsequent programming loops after the threshold voltages of the memory cells MT have reached the verify-low level Vrf1low, the target memory cell is additionally programmed using the QPW voltage Vbl_qpw on the bit line BL and the programming voltage Vpgm on the word line. The QPW voltage Vbl_qpw is applied until the additional programming is completed. The step-up width of the programming voltage Vpgm is chosen such that the threshold voltage of the target memory cell is raised by almost as much as 2VR for each programming loop.

The operation of the control circuit 22 for the group-II memory cells can be summarized as follows. The step-up width ΔVpgm of the programming voltage of the foggy programming pass is adjusted so that the threshold voltages of the memory cells MT are raised by almost twice as much as the verify-level interval of the fine programming pass for each programming loop. The group-II memory cells are additionally programmed under either the bit line voltage Vss or Vbl_qpw depending on the programming states and results of the verify operations, after the threshold voltages of the group-II memory cells have reached the verify-low or verify-high level.

Although the above embodiment describes the case where the step-up width ΔVpgm is adjusted so as to satisfy the condition of ΔVth=2VR, it should be noted that the step-up width ΔVpgm can also be adjusted so that the threshold voltages are raised by as much as three times, four times, or more times the verify-level interval of the fine programming for each programming loop, that is, ΔVth=3VR, 4VR, or nVR, where n is an integer. In such cases, it is necessary to choose appropriate values as a verify-low level, the QPW voltage Vbl_qpw and the additional programming count after verify pass, according to the value of n.

By adopting the modified reduced verify programming technique described above, the foggy programming can be completed within fewer programming loop iterations than the number of valleys of threshold voltage distributions after the foggy programming (for example, fifteen for the QLC-type memory having sixteen threshold voltage distributions). Eventually, programming duration is reduced, and programming speed can be improved. In addition to the small number of programming loops, verify operations at only one verify level around the lower tail of the programming state FS1 contribute to the high-speed programming. Such foggy programming with the small number of loops is enabled by the large step-up width of the programming voltage adjusted so that the threshold voltages of the memory cells are raised for each programming loop by twice as much as a state-to-state interval between two consecutive threshold voltage distributions. The state-dependent bit line voltages enable generation of the fifteen programming voltage distributions through programming loops fewer than fifteen.

Changing the bit line voltage from Vss to Vbl_qpw when proceeding to a next programming loop can effectively reduce the step-up width ΔVpgm of the programming voltage down to almost a half in comparison with the case of a constantly grounded (Vss) bit lines.

The circular point P1 in FIG. 14 indicates the threshold voltage of a group-II memory cell that has directly reached the verify-high level Vrf1 beyond the verify-low level Vrf1low. If the memory cell is to be programmed up to the state FS3, the threshold voltage of the selected memory cell MT is expected to be raised to the threshold voltage of the state FS3 by one subsequent additional program operation, as indicated by a circular point P2 in FIG. 14. Therefore, the memory cell, the threshold voltage of which is at P1, is additionally programmed only once and is program-inhibited after one additional programming loop.

The triangular point P3 in FIG. 14 indicates the threshold voltage of a group-II memory cell that has reached the verify-low level Vrf1 low but has not reached the verify-high level Vrf1. Such a memory cell is to be programmed in the next and subsequent programming loops under the QPW voltage Vbl_qpw applied to the bit line corresponding to the memory cell. The additional programming loop count after the memory cell MT has passed the verify-low level Vrf1 low or the verify-high level Vrf1 is predefined depending on the programming state of the cell. After the memory cell is additionally programmed during the predefined programming count, the threshold voltage of the memory cell is expected to approximately reach the target programming state, and therefore the memory cell is program-inhibited.

In FIG. 14, for example, the threshold voltage of the memory cell at P3 reaches the verify-high level Vrf1 in the next programming loop (Loop #2) as indicated by the triangular point P4. Although the step-up width of the programming voltage Vpgm is adjusted so that the threshold voltage of the cell increases by almost twice as much as the state-to-state interval for each loop, increase of the threshold voltage from P3 to P4 is almost as much as the state-to-state interval. This is because, though Vss is applied to the bit line during Loop #1 programming, the bit line is biased to Vbl_qpw during Loop #2 programming. In Loop #3, since the bit line voltage does not change from Vbl_qpw, the threshold voltage increases by almost twice as much as the state-to-state interval from P4 to P5. It can be seen from FIG. 14 that P5 is roughly included in the threshold voltage region of the state FS3. Therefore, if FS3 is the goal of the memory cell in the foggy programming, the memory cell is program-inhibited from Loop #4.

In the case where a group-II memory cell is to be programmed up to FS3, if the threshold voltage of the memory cell is located at P3 in FIG. 14, that is, if the threshold voltage of the memory cell has reached the verify-low level Vrf1low but has not reached the verify-high level in Loop #1, the threshold voltage of the memory cell is raised to P4 in the state FS1 region by one program operation in Loop #2 and raised to P5 in the state FS3 region by one more program operation in Loop #3, and the memory cell is finally program-inhibited in and after Loop #4.

If a memory cell MT, the threshold voltage of which is located at P2 or P5 in FIG. 14, is to be programmed up to the state FS5, only one additional program operation in Loop #3 or Loop #4 causes the threshold voltage of the memory cell to rise to P6 or P7, to make the memory cell reach the goal.

If a memory cell MT, the threshold voltage of which is located at P6 or P7 around the state FS5, is to be programmed up to the state FS7 (not shown in FIG. 14), only one additional program operation causes the threshold voltage of the memory cell to rise, to make the memory cell reach the state FS7 which is the goal.

Similarly, the threshold voltages of memory cells to be programmed up to FS9, FS11, FS13 or FS15 are raised for each loop by twice as much as the state-to-state interval through step-up programming adjusted to achieve an intended programming speed. Therefore, the first programming pass (the foggy programming) can be completed within short busy duration for the group-II memory cells.

(3) Program Operation for Group-III Memory Cells (FS2, FS4, FS6, FS8, FS10, FS12 and FS14)

Group-III memory cells are also classified into two subgroups based on whether the threshold voltages have directly reached the verify-high level Vrf1 beyond the verify-low level Vrf1low, or the threshold voltages have reached the verify-low level Vrf1low but have not reached the verify-high level Vrf1, similarly to the group-II memory cells. The group-III memory cells belonging to the two subgroups obey different program operations.

Figure 15:
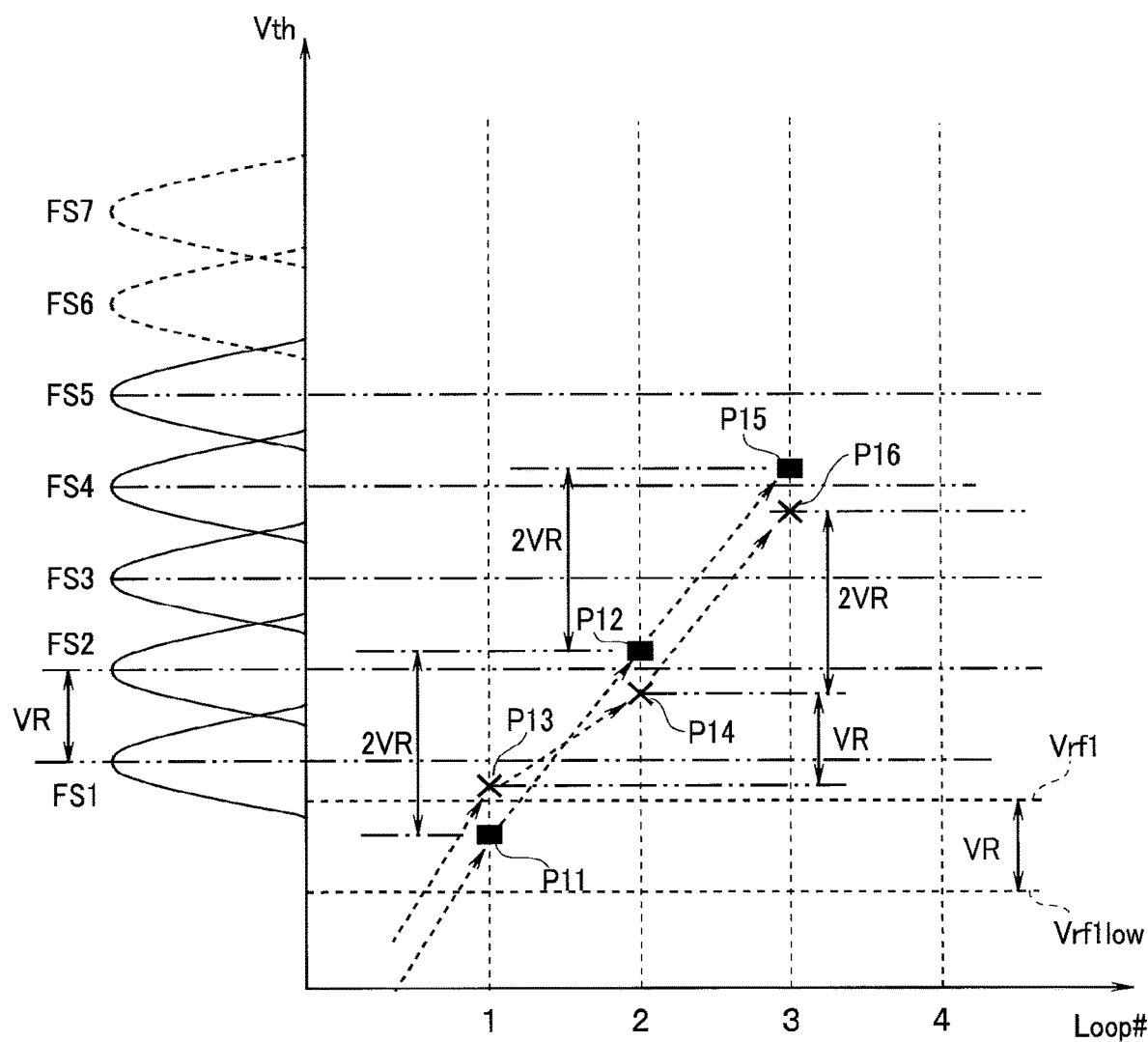
FIG. 15 is a diagram for illustrating a relationship between a loop count and a threshold voltage Vth of a selected memory cell in the first programming pass according to the embodiment.

FIG. 15 is a schematic diagram to understand a relationship between a selected memory cell MT and the programming loop count under the program operation during the foggy programming pass for the group-III memory cells in the present embodiment. Memory cells MT to be programmed up to FS2 and FS4 through the foggy programming pass are shown in FIG. 15 as an example. The horizontal axis in FIG. 15 indicates the loop count of the foggy programming, and the vertical axis indicates the threshold voltages Vth of the group-III memory cells.

The square point P11 in FIG. 15 indicates the threshold voltage of a group-III memory cell that has reached the verify-low level Vrf1low but has not reached the verify-high level Vrf1 in Loop #1.

If the memory cell MT is to be programmed up to the state FS2 in the foggy programming pass, the threshold voltage of the memory cell is raised to the state FS2 by one additional program operation in Loop #2, and the memory cell is program-inhibited in and after Loop #3. The bit line voltage of a memory cell at P11 in Loop #1 is kept being grounded or biased to Vss during the program operation in Loop #2. The programming voltage Vpgm is raised for each programming loop by the step-up width ΔVpgm adjusted so that increase of the threshold-voltage per loop is typically equal to twice as much as the state-to-state threshold voltage interval (that is, ΔVth=2VR). It should be noted that the programming voltage Vpgm is common to all cells in one logical page. Therefore, the step-up width ΔVpgm of the programming voltage for the group-III memory cells cannot be set independently from the step-up width ΔVpgm of the programming voltage for the group-II memory cells. The bit line voltage can be independently chosen for each cell.

In FIG. 15, the cross point P13 indicates the threshold voltage of a group-III memory cell that has directly reached the verify-high level Vrf1 in Loop #1 beyond the verify-low level Vrf1low. If the memory cell MT is to be programmed up to FS2, the threshold voltage of the memory cell is raised up to the cross point P14, which is roughly included in the state FS2, by only one program operation in Loop #2, and the memory cell MT is program-inhibited in and after Loop #3.

The group-III memory cells, the threshold voltages of which have directly reached the verify-high level Vrf1 beyond the verify-low level Vrf1low, are additionally programmed from the next programming loop under the QPW voltage Vbl_qpw applied to the corresponding bit lines BL and the programming voltage Vpgm with the step-up width ΔVpgm described above. Since the QPW voltage is transferred from the bit lines BL to the channels of the memory cells MT, the programming voltage between the channel and the word line of the target cell is reduced from Vpgm-Vss to Vpgm-Vbl_qpw (Vbl_qpw>Vss) by applying the QPW voltage Vbl_qpw to the bit line BL during programming. Therefore, by choosing Vbl_qpw almost equal to VR, an effective step-up width of the programming voltage Vpgm is also reduced from ΔVth=2VR to ΔVth=VR in the first programming loop applying Vbl_qpw. In the next programming loop after the threshold voltages of the memory cells MT have reached the verify-low level Vrf1 low, the target memory cell is additionally programmed under the QPW voltage Vbl_qpw of the bit line BL and the programming voltage Vpgm of the word line. The QPW voltage Vbl_qpw is applied until the additional programming is completed. The step-up width ΔVpgm of the programming voltage Vpgm is chosen such that the threshold voltage of the target memory cell is raised by almost as much as 2VR for each programming loop.

If a memory cell MT, the threshold voltage of which is located at P12 or P14 in FIG. 15, is to be programmed up to the state FS4, only one additional program operation in Loop #3 causes the threshold voltage of the memory cell to rise to P15 or P16, to make the memory cell reach the goal.

If a memory cell MT, the threshold voltage of which is located at P15 or P16 around the state FS4, is to be programmed up to the state FS6 (not shown in FIG. 15), only one additional program operation in Loop #4 causes the threshold voltage of the memory cell to rise, to make the memory cell reach the state FS6 which is the goal.

Similarly, as for memory cells to be programmed up to FS8, FS10, FS12 or FS14, the threshold voltages are raised by twice as much as the state-to-state interval in each loop through the step-up programming adjusted to achieve an intended programming speed. Therefore, the first programming pass (the foggy programming) can be completed within short busy duration for the group-III memory cells.

FIG. 16 is a table showing grouping of the programming states and bit line voltages for each group during additional programming.

As shown in FIG. 16, if a threshold voltage of a memory cell MT to be programmed up to FS1 has reached the verify-high level Vrf1 in the process of the step-up programming, the memory cell is program-inhibited in the subsequent programming loops, and no additional loops are given. If a threshold voltage of another memory cell MT has reached the verify-low level Vrf1 low but has not reached the verify-high level Vrf1, a predefined QPW voltage Vbl_qpw is applied to the corresponding bit line of said memory cell in the additional programming loops.

Therefore, after detecting that the threshold voltage of a memory cell to be programmed up to a group-I state is between the verify-low level Vrf1 low and the verify-high level Vrf1, the control circuit 22 applies the bit line voltage Vbl_qpw to said memory cell MT. After detecting that the threshold voltage of another memory cell to be programmed up to a group-I state is above the verify-high level Vrf1, the control circuit 22 applies the bit line voltage Vinhibit to said memory cell MT, and programming to said memory cell is inhibited in the subsequent programming loops.

If a threshold voltage of a memory cell MT to be programmed to FS3, FS5, FS7, FS9, FS11, FS13 or FS15 has directly reached the verify-high level Vrf1 in the process of the step-up programming, said memory cell is additionally programmed with the bit line voltage of Vss (for example, 0 V) in the programming loop and subsequent loops. On the other hand, if a threshold voltage of another memory cell to be programmed to FS3, FS5, FS7, FS9, FS11, FS13 or FS15 has reached the verify-low level Vrf1 low but has not reached the verify-high level Vrf1, a predefined QPW voltage Vbl_qpw is applied to the corresponding bit line of said memory cell in the additional programming loops.

Therefore, after detecting that the threshold voltage of a memory cell MT to be programmed to a group-II state is between the verify-low and verify-high levels, the control circuit 22 applies the bit line voltage Vbl_qpw to said memory cell MT and programs said memory cell MT for a predefined programming loop count. After detecting that the threshold voltage of another memory cell to be programmed to a group-II state is above the verify-high level Vrf1, the control circuit 22 applies the bit line voltage Vss to said memory cell and programs said memory cell for a predefined programming loop count.

If a threshold voltage of a memory cell MT to be programmed up to FS2, FS4, FS6, FS8, FS10, FS12 or FS14 has directly reached the verify-high level Vrf1 in the process of the step-up programming, said memory cell is additionally programmed using the bit line voltage of a predefined QPW voltage Vbl_qpw in the subsequent programming loops. On the other hand, if a threshold voltage of another memory cell MT to be programmed up to FS2, FS4, FS6, FS8, FS10, FS12 or FS14 has reached the verify-low level Vrf1low but has not reached the verify-high level Vrf1, the ground voltage Vss is applied to the corresponding bit line of said memory cell in the additional programming loops.

Therefore, after detecting that the threshold voltage of a memory cell to be programmed to a group-III state is between the verify-low and verify-high levels, the control circuit 22 applies the bit line voltage Vss to said memory cell and programs said memory cell for a predefined programming loop count. After detecting that the threshold voltage of a memory cell to be programmed to a group-III state is above the verify-high level Vrf1, the control circuit 22 applies the bit line voltage Vbl_qpw to said memory cell and programs said memory cell for a predefined programming loop count.

The table in FIG. 17 shows the additional programming count and bit line voltages for each programming state. The table of FIG. 17 is a basis for the control circuit 22 to control the memory cell array 23.

Each programming state has a group index (I, II or III), the additional programming loop count, and the bit line voltage during the additional programming for two cases (the case of Vth>Vrf1 and the case of Vrf1low<Vth<Vrf1). The definitions of the values provided by the present embodiment are summarized in the table of FIG. 17. The definitions of the bit line voltages for the two cases are separately shown for each state.

In FIG. 17, counting of the number of additional programming loops for the group-III states starts when the threshold voltages of the memory cells have reached either the verify-high level Vrf1 or the verify-low level Vrf1low. On the other hand, counting of the number of additional programming loops for the group-I and group-II states starts when the threshold voltages of the memory cells have directly reached the verify-high level Vrf1 beyond the verify-low level Vrf1 low or when the threshold voltages of the memory cells are expected to have reached the verify-high level Vrf1 in a programming loop that is one loop after the programming loop in which the threshold voltages of the memory cells have reached the verify-low level Vrf1 low but failed in the verify-high level. In the fourth and fifth rows in FIG. 17, "0" indicates that the bit line BL is biased to Vss or 0 V, "+" indicates that the bit line BL is biased to Vbl_qpw (>0), and "I" indicates that the bit line BL is biased to Vinhibit so that programming is inhibited.

For example, the additional programming loop count for the memory cells of the state FS1 (group-I) is zero according to FIG. 17. Therefore, the memory cells to be programmed up to the state FS1, the threshold voltages of which have directly passed the verify-high level Vrf1 beyond the verify-low level Vrf1 low, are to be program-inhibited from the next programming loop. The memory cells of the state FS1, the threshold voltages of which have passed the verify-low level Vrf1low but have not passed the verify-high level Vrf1, are to be programmed under the QPW voltage Vbl_qpw in the next loop and program-inhibited from the further next loop where the threshold voltages of the memory cells are expected to have reached the verify-high level Vrf1.

The additional programming loop count for memory cells of the state FS2 (group-III) is one according to FIG. 17. Therefore, the memory cells of the state FS2 are to be additionally programmed for one loop after the threshold voltages of said memory cells have reached either the verify-low level Vrf1 low or the verify-high level Vrf1. If the threshold voltages of the memory cells to be programmed to the state FS2 have directly reached the verify-high level Vrf1 beyond the verify-low level Vrf1 low, the bit line voltage is set to Vbl_qpw during the additional programming. If the threshold voltages of the memory cells to be programmed up to the state FS2 have reached the verify-low level Vrf1low but have not reached the verify-high level Vrf1, the bit line voltage is set to Vss or 0 V during the additional programming.

The additional programming loop count for memory cells of the state FS3 (group-II) is one according to FIG. 17. Therefore, the memory cells to be programmed up to the state FS3, the threshold voltages of which have directly passed the verify-high level Vrf1 beyond the verify-low level Vrf1low, are additionally programmed for one loop after the threshold voltages of said memory cells have reached the verify-high level Vrf1. The corresponding bit lines are biased to Vss or 0 V. On the other hand, the memory cells MT to be programmed up to the state FS3, the threshold voltages of which have passed the verify-low level Vrf1low and have not passed the verify-high level Vrf1, are additionally programmed for one loop after the programming loop in which the threshold voltages of the memory cells MT are expected to have reached the verify-high level Vrf1. In other words, if the threshold voltages of the memory cells to be programmed to the state FS3 have reached the verify-low level Vrf1low but have not reached the verify-high level Vrf1, the memory cells MT are to be additionally programmed for two loops after the threshold voltages of said memory cells have reached the verify-low level. The corresponding bit lines are biased to Vbl_qpw during the additional programming.

The additional programming loop count for memory cells of the state FS4 (group-III) is two according to FIG. 17. Therefore, the memory cells of the state FS4 are to be additionally programmed for two loops after the threshold voltages of said memory cells have reached either the verify-low level Vrf1low or the verify-high level Vrf1. If the threshold voltages of the memory cells to be programmed to the state FS4 have directly reached the verify-high level Vrf1 beyond the verify-low level Vrf1low, the bit line voltage is set to Vbl_qpw during the additional programming. If the threshold voltages of the memory cells to be programmed up to the state FS4 have reached the verify-low level Vrf1low but have not reached the verify-high level Vrf1, the bit line voltage is set to Vss or 0 V during the additional programming.

The additional programming loop count for memory cells of the state FS5 (group-II) is two according to FIG. 17. Therefore, the memory cells to be programmed up to the state FS5, the threshold voltages of which have directly passed the verify-high level Vrf1 beyond the verify-low level Vrf1 low, are additionally programmed for two loops after the threshold voltages of said memory cells have reached the verify-high level Vrf1. The corresponding bit lines are biased to Vss or 0 V. The memory cells MT to be programmed up to the state FS5, the threshold voltages of which have passed the verify-low level Vrf1 low but have not passed the verify-high level Vrf1, are additionally programmed for two loops after the threshold voltages of said memory cells MT are expected to have reached the verify-high level Vrf1. In other words, if the threshold voltages of the memory cells to be programmed to the state FS5 have reached the verify-low level Vrf1low but have not reached the verify-high level Vrf1, the memory cells MT are to be additionally programmed for three loops after the threshold voltages of said memory cells have reached the verify-low level. The corresponding bit lines are biased to Vbl_qpw during the additional programming.

For higher states, programming is similarly performed based on FIG. 17. The additional programming loop count for the memory cells of the state FS10 (group-III) is five according to FIG. 17. Therefore, the memory cells of the state FS10 are to be additionally programmed for five loops after the threshold voltages of said memory cells have reached either the verify-low level Vrf1low or the verify-high level Vrf1. If the threshold voltages of the memory cells to be programmed to the state FS10 have directly reached the verify-high level Vrf1 beyond the verify-low level Vrf1low, the bit line voltage is set to Vbl_qpw during the additional programming. If the threshold voltages of the memory cells to be programmed up to the state FS10 have reached the verify-low level Vrf1low but have not reached the verify-high level Vrf1, the bit line voltage is set to Vss or 0 V during the additional programming.

The additional programming loop count for the memory cells of the state FS11 (group-II) is five according to FIG. 17. Therefore, memory cells to be programmed up to the state FS11, the threshold voltages of which have directly passed the verify-high level Vrf1 beyond the verify-low level Vrf1low, are additionally programmed for five loops after the threshold voltages of said memory cells have reached the verify-high level Vrf1. The corresponding bit lines are biased to Vss or 0 V. On the other hand, the memory cells MT to be programmed up to the state FS11, the threshold voltages of which have passed the verify-low level Vrf1low but have not passed the verify-high level Vrf1, are additionally programmed for five loops after the programming loop in which the threshold voltages of the memory cells MT are expected to have reached the verify-high level Vrf1. In other words, if the threshold voltages of the memory cells to be programmed to the state FS11 have reached the verify-low level Vrf1 low but have not reached the verify-high level Vrf1, the memory cells MT are to be additionally programmed for six loops after the threshold voltages of said memory cells have reached the verify-low level. The corresponding bit lines are biased to Vbl_qpw during the additional programming.

Thus, when memory cells are being programmed to one of the programming states in the process of the foggy programming, the control circuit 22 judges whether or not the threshold voltages Vth of the memory cells MT have reached the verify-high level Vrf1 or the verify-low level Vrf1low by the bit line current detected by the sense amplifier circuit 24. Then, depending on a result of the judgment and the programming state of each of the memory cells, the control circuit 22 controls the word line WL and the bit line BL such that each of the memory cells is to be additionally programmed for the predefined programming count under the predefined bit line voltage.

It should be noted that the verify-high level Vrf1 and the verify-low level Vrf1 low are located at the lower tail of the threshold voltage distribution of the second lowest programming state in the present embodiment.

It should be also noted that two or more programming states of memory cells are classified into three groups (I to III), and each programming state belongs to one of the three groups. The three groups of the programming states have mutually different bit line voltages during the additional programming.

The fine programming is executed after the foggy programming described above.

(Second Programming Pass: Fine Programming Pass)

In the fine programming pass, one or more programming loops each including a program operation and a verify operation are successively iterated. In the fine programming, the threshold voltage of a selected memory cell on a selected word line is raised in each programming loop by a step-up width smaller than the step-up width of the foggy programming. The step-up width ΔVpgm of the programming voltage Vpgm of the fine programming pass is set smaller than that of the foggy programming pass.

The memory cells programmed to the state FS1 in the foggy programming pass are to be programmed up to the state S1 in the fine programming pass. The memory cells programmed to the state FS2 in the foggy programming pass are to be programmed up to the state S2 in the fine programming pass. Similarly, the memory cells programmed to the states FS3 to FS15 are to be programmed up to the states S3 to S15, respectively, in the fine programming pass.

A purpose of the verify operations is to judge whether or not the threshold voltages of memory cells have reached the verify level, in other words, whether or not the program data has already been correctly programmed into the memory cells. The verify operations are basically the same as read operations, but the verify operations are executed as a part of the step-up program operations with the purpose of checking the threshold voltages of the memory cells.

Since the threshold voltages of the selected memory cells are raised little by little in the step-up programming, the threshold voltages of the selected memory cells approach the verify level (a reference voltage) of the aimed programming state and finally reach the verify level. Then, the memory cells are judged to have passed verification.

If the threshold voltages of the memory cells pass verification, programming to said memory cells are terminated, and the corresponding bit lines of the memory cells transitions to an unselected (program-inhibited) state. For example, the sense amplifier circuit 24 raises the bit line voltages of the memory cells that have passed verification to the program-inhibited voltage Vinhibit, which causes the channel of the memory cells to be electrically floating and prevents the programming voltage from being applied to said memory cells even if the programming voltage is applied to the selected word line. Thus, the threshold voltages of the memory cells that have passed verification are not raised anymore in the subsequent programming loops. Therefore, the threshold voltages of the selected memory cells stay around the verify level and is distributed closely above the verify level.

The term "selected state" refers to a state in which the bit line voltage is biased to a sufficiently low voltage under the programming voltage Vpgm applied to one of the word lines so that the programming voltage is fully applied to the selected memory cell. The term "unselected state" refers to a state in which the bit line voltage is biased to a certain positive value so that the channel of said selected memory cell is cut off by a select gate transistor and in an electrically floating state, which results in reduction of the voltage between the word line and the channel.

A programming sequence is controlled by the control portion 22, the sense amplifier circuit 24, and the word line driver 25. The sequence for word line programming is in the order of WL0, WL1, WL2, . . . and WL7.

The threshold voltages Vth of the selected memory cells MT are consequently included in the threshold voltage distributions shown in the lower part of FIG. 5.

Thus, the present embodiment described above realizes a semiconductor storage apparatus capable of high-precision and low-duration data programming.

It should be especially emphasized that the programming duration of the foggy programming per word line can be reduced to almost a half by setting the step-up width ΔVpgm of the programming voltage Vpgm such that the step-up width ΔVth of threshold voltage is equal to almost twice as much as the state-to-state interval VR of the threshold voltage distributions (that is, ΔVth=2VR).

It should be noted that although the case of ΔVth=2VR is described in the above embodiment, the step-up width of the programming voltage Vpgm may be set to satisfy ΔVth=2VR. In other words, the step-up width ΔVpgm of the programming voltage Vpgm does not have to strictly correspond to twice the state-to-state threshold voltage interval VR. The step-up width of the programming voltage has only to be maximized without a loss of precision of the threshold voltage after the fine programming. Such a condition is typically satisfied by the condition of ΔVth=2VR.

It should also be noted that although a difference between the verify-low and the verify-high levels corresponds to the state-to-state threshold voltage interval VR in the present embodiment, the difference has only to approximately correspond to VR.

In the present embodiment, counting of the number of additional programming loops of the group-I and group-II states starts when the threshold voltages of the memory cells are expected to have reached the verify-high level in a programming loop that is one loop after the programming loop in which the threshold voltages of the memory cells have reached the verify-low level Vrf1 low but failed in the verify-high level Vrf1. However, counting of the number of additional programming loops can also start when the threshold voltages of the memory cells are definitely confirmed to have reached the verify-high level Vrf1. In such a case, counting of the number of additional programming loops does not necessarily start in a loop next to the programming loop in which the threshold voltages of the memory cells have reached the verify-low level Vrf1 low. Additional programming loops for the group-III states can also start in a programming loop in which the threshold voltages of the memory cells are definitely confirmed to have reached the verify-high level Vrf1.

The followings are modified embodiments of the embodiment.

Modified Embodiment 1

The above-described embodiment deals with the improved reduced verify programming in the foggy programming pass, in which the verify operations at the two verify levels, that is, the verify-low and verify-high levels of the state FS1, are shared among the memory cells MT to be programmed to the states FS1 to FS15. However, another embodiment is also possible, where verify operations at four verify levels, that is, the verify-low and verify-high levels of the state FS1 and those of another state (for example, the state FS8) are executed in the foggy programming pass.

In the present modified embodiment, the states FS1 and FS8 belong to the group-I. Verify-read operations are executed at two verify levels placed around the lower tail of the threshold voltage distribution of each of states of the group-I. The verify-read operations are comparison of the threshold voltages with the verify-high level Vrf and the verify-low level Vrflow. The verify-low level Vrflow is lower than the verify-high level Vrf.

The control circuit 22 judges whether the threshold voltages of the memory cells to be programmed up to the state FS1 are above the verify-high level Vrf1, between the verify-high level Vrf1 and the verify-low level Vrf1 low lower than Vrf1, or below the verify-low level Vrf1low. The control circuit 22 also judges whether the threshold voltages of the memory cells to be programmed up to the state FS8 are above the verify-high level Vrf8, between the verify-high level Vrf8 and the verify-low level Vrf8low lower than Vrf8, or below the verify-low level Vrf8low.

The programming states FS3, FS5, FS7, FS10, FS12 and FS14 belong to the group-II, and the programming states FS2, FS4, FS6, FS9, FS11, FS13 and FS15 belong to the group-III. Verify operations are not separately executed for the verify levels around the lower tails of the programming states of the group-II and the group III, because the programming states share the verify levels with the states FS1 or FS8.

Program operations for the memory cells MT of each group are the same as those in the above-described embodiment. Only the additional programming loop count and the definition of a bit line BL voltage for each state differ from those in the former embodiment.

The table in FIG. 18 shows the additional programming count and bit line voltages for each programming state in a case where verify operations are executed at the verify levels of the states FS1 and FS8.

As shown in FIG. 18, if the threshold voltage of a memory cell MT to be programmed up to the state FS1 or FS8 has directly reached a corresponding verify-high level (the verify-high level Vrf1 or Vrf8) beyond the verify-low level, during a process of step-up programming, said memory cell MT is program-inhibited in the subsequent programming loops. If the threshold voltage of another certain memory cell MT to be programmed up to the state FS1 or FS8 has reached a corresponding verify-low level (the verify-low level Vrf1low or Vrf8low) but failed in a corresponding verify-high level (the verify-high level Vrf1 or Vrf8), then the bit line BL of said memory cell MT is biased to the QPW voltage Vbl_qpw in the subsequent programming loops.

If the threshold voltage Vth of a memory cell MT to be programmed up to FS3, FS5, FS7, FS10, FS12 or FS14 has directly reached a corresponding verify-high level (the verify-high level Vrf1 or Vrf8) beyond the verify-low level, then said memory cell is additionally programmed with a bit line voltage of Vss (for example, 0 V) in the subsequent programming loops. The additional programming loop count is defined for each state. If the threshold voltage Vth of another memory cell MT to be programmed up to FS3, FS5, FS7, FS10, FS12 or FS14 has reached a corresponding verify-low level (the verify-low level Vrf1 low or Vrf8low) but failed in a corresponding verify-high level (the verify-high level Vrf1 or Vrf8), then a predefined QPW voltage Vbl_qpw is applied to the corresponding bit line of said memory cell in the additional programming loop.

The bit line voltage during the additional programming and the additional programming loop count for the memory cell MT to be programmed up to the state FS3, FS5 or FS7 are decided based on results of the verify operations at the two verify levels of the state FS1 for detecting whether the threshold voltage Vth has reached the verify-high level Vrf1 or the verify-low level Vrf1 low.

The bit line voltage during the additional programming and the additional programming loop count for the memory cell MT to be programmed up to the state FS10, FS12 or FS14 are decided based on results of the verify operations at the two verify levels of the state FS8 for detecting whether the threshold voltage Vth has reached the verify-high level Vrf8 or the verify-low level Vrf8low.

If the threshold voltage Vth of a memory cell MT to be programmed up to FS2, FS4, FS6, FS9, FS11, FS13 or FS15 has reached a corresponding verify-low level (the verify-low level Vrf1low or Vrf8low) but failed in a corresponding verify-high level (the verify-high level Vrf1 or Vrf8), then said memory cell is additionally programmed with the bit line voltage of Vss (for example 0 V) in the subsequent programming loops. The additional programming loop count is defined for each state. On the other hand, if the threshold voltage of another memory cell MT to be programmed up to FS2, FS4, FS6, FS9, FS11, FS13 or FS15 has directly reached a corresponding verify-high level (the verify-high level Vrf1 or Vrf8) beyond the verify-low level, then a predefined QPW voltage Vbl_qpw is applied to the corresponding bit line of said memory cell in the additional programming loop.

The table in FIG. 19 shows the additional programming count and bit line voltages for each programming state similarly to FIG. 17. The table in FIG. 19 is a basis for the control circuit 22 to control the memory cell array 23.

Each programming state has a group index (I, II or III), the additional programming loop count, and the bit line voltages during the additional programming for two cases (the case of Vth>Vrf and the case of Vrflow<Vth<Vrf). The definitions of the values provided by the present modified embodiment are summarized in the table of FIG. 19. The definitions of the bit line voltages for the two cases are separately shown for each of the states.

In FIG. 19, counting of the number of additional programming loops for the group-III states starts when the threshold voltage of each of the memory cells has reached a corresponding verify-high level (the verify-high level Vrf1 or Vrf8), or a corresponding verify-low level (the verify-low level Vrf1 low or Vrf8low). Counting of the number of additional programming loops for the group-I and group-II states starts when the threshold voltage of each of the memory cells has directly reached a corresponding verify-high level (the verify-high level Vrf1 or Vrf8) beyond a corresponding verify-low level, or when the threshold voltage of each of the memory cells is expected to have reached a corresponding verify-high level in a programming loop that is one loop after the programming loop in which the threshold voltage of each of the memory cells has reached the corresponding verify-low level (the verify-low level Vrf1 low or Vrf8low) but failed in the verify-high level. In the fourth and fifth rows in FIG. 19, "0" indicates that the bit line BL is biased to Vss or 0 V; "+" indicates that the bit line BL is biased to Vbl_qpw (>0); and "I" indicates that the bit line BL is biased to Vinhibit so that programming is inhibited.

For example, the additional programming loop count for memory cells of the state FS8 (group-I) is zero according to FIG. 19. Therefore, the memory cells to be programmed up to the state FS8, the threshold voltages of which have directly passed the verify-high level Vrf8 beyond the verify-low level Vrf81low, are program-inhibited from the next programming loop. On the other hand, the memory cells of the state FS8, the threshold voltages of which have passed the verify-low level Vrf8low but have not passed the verify-high level Vrf8, are to be programmed under the QPW_voltage Vbl_qpw in the next loop and program-inhibited from the further next loop where the memory cells are expected to have reached the verify-high level Vrf1.

Similarly, the additional programming loop count for memory cells of the state FS1 (group-III) is two according to FIG. 19. Therefore, the memory cells of the state FS11 are to be additionally programmed for two loops after the threshold voltages of said memory cells have reached either the verify-low level Vrf8low or the verify-high level Vrf8. If the threshold voltages of the memory cells to be programmed to the state FS11 have directly reached the verify-high level Vrf8 beyond the verify-low level Vrf8low, the bit line voltage is set to Vbl_qpw during the additional programming. If the threshold voltages of the memory cells to be programmed up to the state FS11 have reached the verify-low level Vrf8low but have not reached the verify-high level Vrf8, the bit line voltage is set to Vss or 0 V during the additional programming.

After the foggy programming pass (a first programming pass) is executed as described above, the fine programming pass (a second programming pass) is executed.

Figure 20:
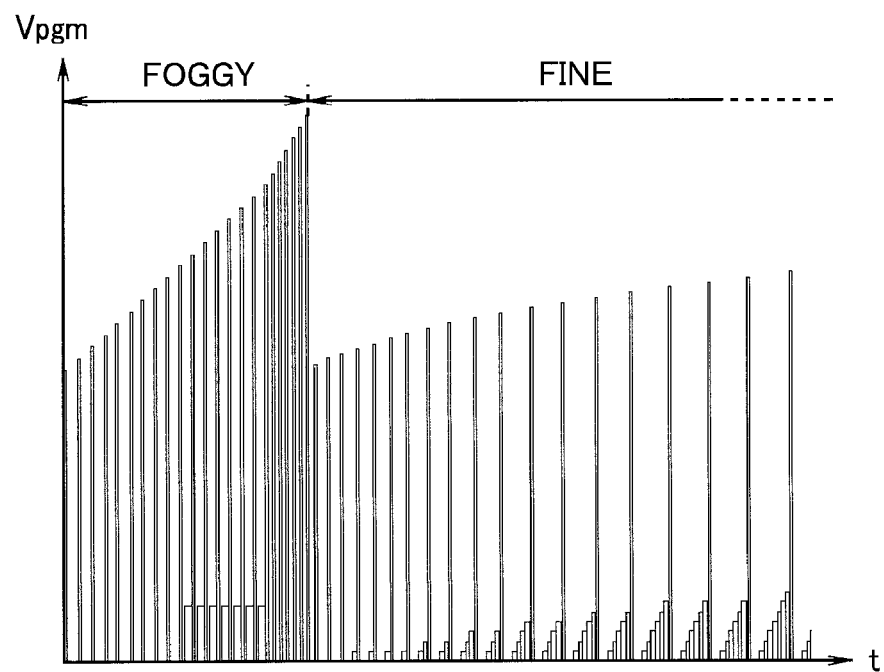
FIG. 20 is a graph showing change in a pulse waveform of a programming voltage Vpgm with passage of a time period in the case of not using a two-stage programming method of the modified embodiment 1 of the embodiment.
Figure 21:
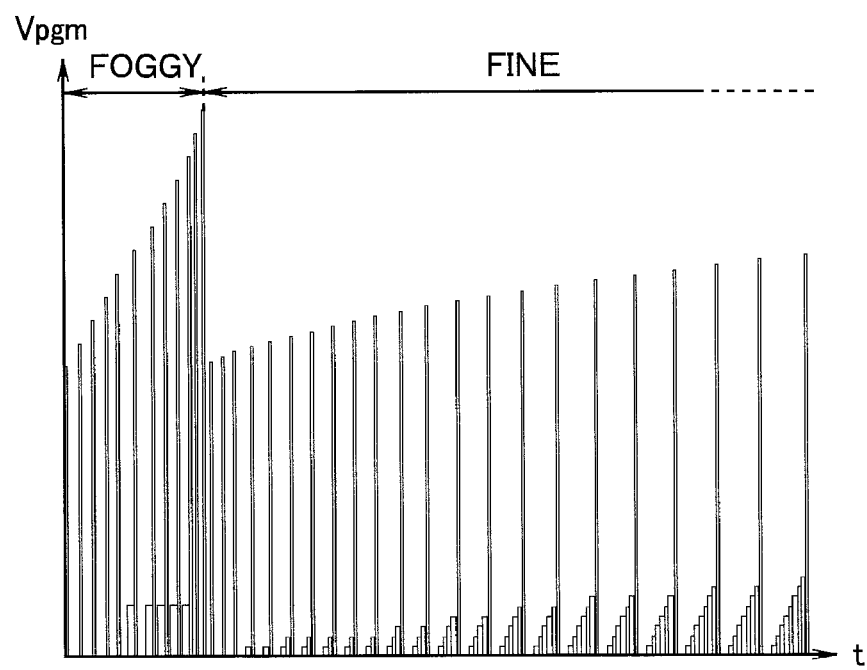
FIG. 21 is a graph showing change in a pulse waveform of the programming voltage Vpgm with passage of a time period in the case of using the two-stage programming method of the modified embodiment 1 of the embodiment.

FIGS. 20 and 21 show examples of computer simulations of voltage waveforms applied to a selected word line. FIG. 20 shows a case of a conventional reduced verify programming technique in the foggy programming pass, where the step-up width of the programming voltage Vpgm is defined such that the threshold voltages of memory cells are raised only one time (not twice) as much as the state-to-state threshold voltage interval VR (that is, ΔVth=VR) for each loop, and the bit line voltage during the foggy programming is applied in common to all the memory cells of the programming states of FS1 to FS15. In FIG. 20, the programming states are not classified into three groups. FIG. 21 shows a case of the improved reduced verify programming technique described above in the present modified embodiment.

Actually, a program operation to an adjacent word line is inserted between the foggy programming and the fine programming as described above in order to reduce the influence among neighbor word lines. However, only the program operations to a selected word line are shown in FIGS. 20 and 21, and the program operations to an adjacent word line is not shown in FIGS. 20 and 21 for simplicity.

As seen from FIG. 21, since the step-up width of the programming voltage is set to satisfy ΔVth=2VR, the duration of the foggy programming of the present modified embodiment is much shorter than the conventional reduced verify programming shown in FIG. 20.

Figure 22:
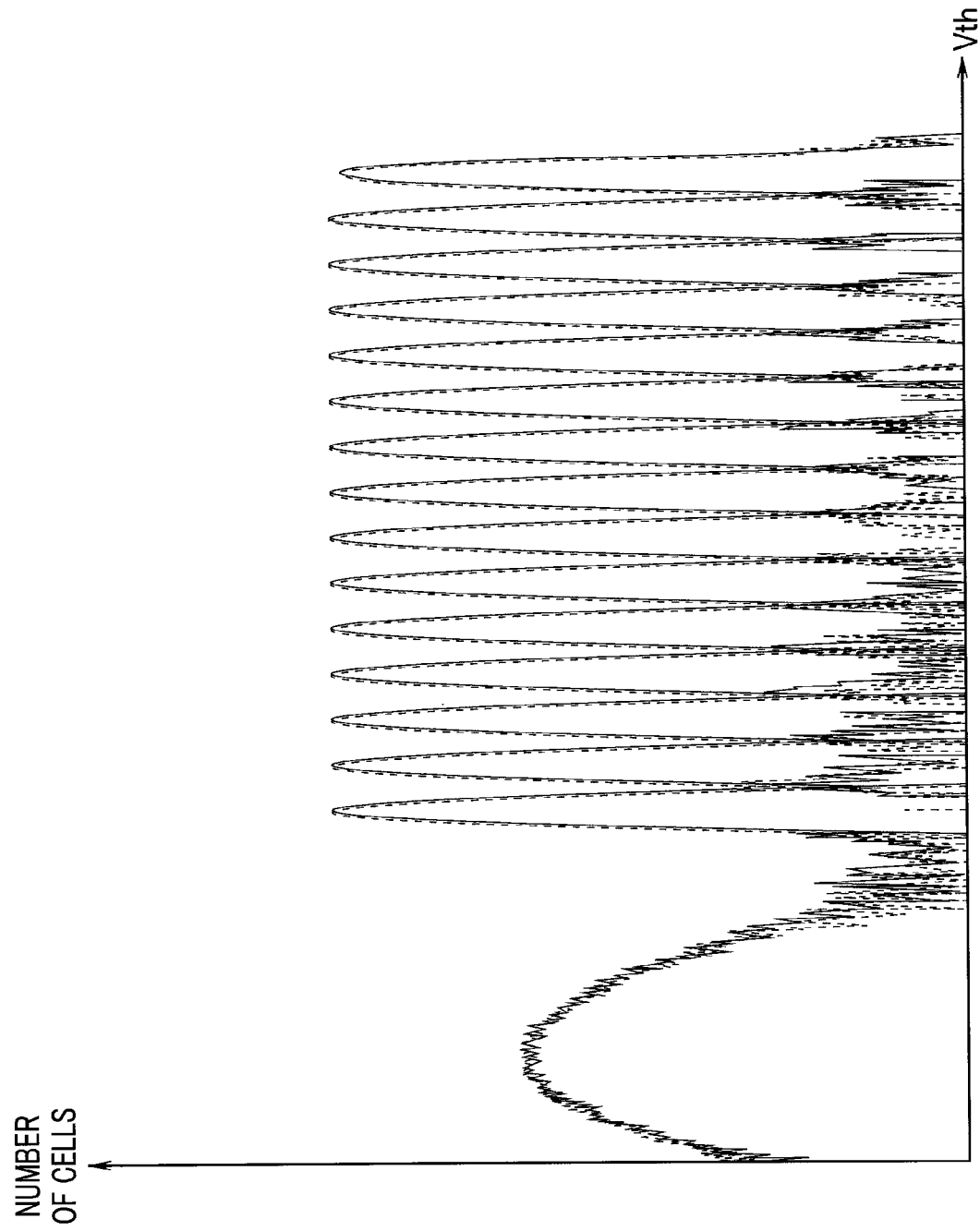
FIG. 22 is a graph showing distributions of threshold voltages obtained as a result of simulation, according to the modified embodiment 1 of the embodiment.

FIG. 22 shows threshold voltage distributions after the fine programming pass obtained by the above-described simulations. The vertical axis in FIG. 22 indicates the number of cells in a logarithmic scale, and the horizontal axis in FIG. 22 indicates the threshold voltage. In FIG. 22, the solid lines indicate a case of the conventional reduced verify programming shown in FIG. 20 in which the present modified embodiment 1 is not used, and the dotted lines indicate a case of the improved reduced verify programming technique shown in FIG. 21 using the present modified embodiment 1.

As seen from FIG. 22, the threshold voltage distributions are not degraded by applying the improved reduced verify programming technique embodied in the present application.

Thus, the above-described modified embodiment 1 can also improve data programming speed.

In the present modified embodiment 1, counting of the number of additional programming loops for the group-I and group-II states starts when the threshold voltage of each of the memory cells is expected to have reached the verify-high level in a loop that is one loop after the loop in which the threshold voltage of each of the memory cells has reached the verify-low level Vrf1low or Vrf8low but failed in the verify-high level Vrf1 or Vrf8. However, counting of the number of additional programming loops can also start when the threshold voltage of each of the memory cells is definitely confirmed to have reached the verify-high level Vrf1 or Vrf8. In such a case, counting of the number of additional programming loops does not necessarily start in the next loop of the programming loop in which the threshold voltage of the each of the memory cells has reached the verify-low level Vrf1 low or Vrf8low. Counting of the number of additional programming loops for the group-III states can also start in a programming loop in which the threshold voltage of each of the memory cells is definitely confirmed to have reached the verify-high level Vrf1 or Vrf8.

Modified Embodiment 2

The above-described modified embodiment 1 deals with the improved reduced verify programming in the foggy programming pass, in which verify operations at four verify levels, that is, the verify-low and verify-high levels of the states FS1 and FS8, are shared among the memory cells MT to be programmed to the states FS1 to FS15. However, another modified embodiment is also possible, where verify operations at eight verify levels, that is, the verify-low and verify-high levels of the states FS1 and FS8, and additional other two states (for example, FS4 and FS12) are executed in the foggy programming pass.

In the present modified embodiment, the states FS1, FS4, FS8 and FS12 belong to the group-I. Verify-read operations are performed at two verify levels placed around the lower tail of the threshold voltage distribution of each of states of the group-I. The verify-read operations are comparison of the threshold voltages with the verify-high level Vrf and the verify-low level Vrflow. The verify-low level Vrflow is lower than the verify-high level Vrf.

If the threshold voltage of a memory cell MT to be programmed up to the state FS1, FS4, FS8 or FS12 has reached a corresponding verify-low level (the verify-low level Vrf1 low, Vrf4low, Vrf8low or Vrf12low) but failed in a corresponding verify-high level (the verify-high level Vrf1, Vrf4, Vrf8 or Vrf12), then the bit line BL of said memory cell MT is biased to the QPW voltage Vbl_qpw in the subsequent programming loops.

Until the threshold voltage of said memory cell to be programmed up to FS1, FS4, FS8 or FS12 is definitely confirmed to have exceeded the corresponding verify-high level Vrf1, Vrf4, Vrf8 or Vrf12, the QPW voltage Vbl_qpw is applied to the said memory cell.

If the threshold voltage of a memory cell MT to be programmed up to the group-I or group-II states has reached a corresponding verify-low level (the verify-low level Vrf1low, Vrf4low, Vrf8low or Vrf12low) but failed in a corresponding verify-high level (the verify-high level Vrf1, Vrf4, Vrf8 or Vrf12), then it is also possible for said memory cell to be programmed without the verify operations up to a programming loop in which the threshold voltage of said memory cell is expected to reach the corresponding verify-high level.

If the threshold voltage of a memory cell MT to be programmed up to the state FS1, FS4, FS8, or FS12 has directly reached a corresponding verify-high level (the verify-high level Vrf1, Vrf4, Vrf8, or Vrf12) beyond the verify-low level during the process of step-up programming, then said memory cell MT is program-inhibited in the subsequent programming loops.

Memory cells MT to be programmed up to FS3, FS6, FS10, or FS14 belong to the group-II, and memory cells MT to be programmed up to FS2, FS5, FS7, FS9, FS11, FS13, or FS15 belong to the group-III. Verify operations are not separately executed for verify levels around the lower tails of the programming states of group-II and III, because the programming states share the verify levels with the states FS1, FS4, FS8 or FS12.

If the threshold voltage of a memory cell MT to be programmed up to the state FS3, FS6, FS10 or FS14 has reached a corresponding verify-low level (the verify-low level Vrf1low, Vrf4low, Vrf8low or Vrf12low) but failed in a corresponding verify-high level (the verify-high level Vrf1, Vrf4, Vrf8 or Vrf12), then the bit line voltage of said memory cell MT is biased to the voltage equal to the QPW voltage Vbl_qpw in the subsequent programming loops, and said memory cell MT is programmed until the threshold voltage of said memory cell reaches a corresponding verify level (the verify-high levels Vrf1, Vrf4, Vrf8 or Vrf12).

After the threshold voltage Vth has reached the verify-high level Vrf1, Vrf4, Vrf8 or Vrf12, said memory cell is programmed for the additional programming loop count defined for each state. The step-up width $\Delta Vpgm$ of the programming voltage Vpgm of the additional program operation is set to satisfy $\Delta Vth=2VR$.

When the threshold voltage Vth of a memory cell MT has directly reached the verify-high level Vrf1, Vrf4, Vrf8 or Vrf12 beyond the verify-low level Vrf1low, Vrf4low, Vrf8low or Vrf12low, then said memory cell is programmed with the bit line voltage equal to the ground voltage Vss (for example, 0 V) for the additional programming loop count defined for each state.

The bit line voltage during the additional programming and the additional programming loop count for the memory cell MT to be programmed up to the state FS3 are decided based on the results of the verify operations at the two verify levels of the state FS1 for detecting whether the threshold voltage Vth has reached the verify-high level Vrf1 or the verify-low level Vrf1 low.

The bit line voltage during the additional programming and the additional programming loop count for the memory cell MT to be programmed up to the state FS6 are decided based on the results of the verify operations at the two verify levels of the state FS4 for detecting whether the threshold voltage Vth has reached the verify-high level Vrf4 or the verify-low level Vrf4low.

The bit line voltage during the additional programming and the additional programming loop count for the memory cell MT to be programmed up to the state FS10 are decided based on the results of the verify operations at the two verify levels of the state FS8 for detecting whether the threshold voltage Vth has reached the verify-high level Vrf8 or the verify-low level Vrf8low.

The bit line voltage during the additional programming and the additional programming loop count for the memory cell MT to be programmed up to the state FS14 are decided based on the results of the verify operations at the two verify levels of the state FS12 for detecting whether the threshold voltage Vth has reached the verify-high level Vrf12 or the verify-low level Vrf12low.

In the present modified embodiment, the memory cell to be programmed up to FS3, FS6, FS10 or FS14 is additionally programmed for one loop after the threshold voltage of said memory cell has reached the corresponding verify level (the verify-high level Vrf1, Vrf4, Vrf8 or Vrf12).

If the threshold voltage Vth of a memory cell to be programmed to the group-III state (FS2, FS5, FS7, FS9, FS11, FS13 or FS15) has reached a corresponding verify-low level (the verify-low levels Vrf1 low, Vrf4low, Vrf8low or Vrf12low) but has not reached a corresponding verify-high level (the verify-high levels Vrf1, Vrf4, Vrf8 or Vrf12), then said memory cell is programmed with the grounded bit line voltage Vss (for example 0 V) for the additional programming loop count defined for each state from the next programming loop.

If the threshold voltage Vth of the memory cell to be programmed to the group-III state (FS2, FS5, FS7, FS9, FS11, FS13 or FS15) has directly reached a corresponding verify-high level (the verify-high level Vrf1, Vrf4, Vrf8 or Vrf12) beyond a corresponding verify-low level (the verify-low level Vrf1low, Vrf4low, Vrf8low or Vrf12low), then said memory cell is programmed with the bit line voltage equal to the QPW voltage Vbl_qpw for the additional programming loop count defined for each state from the next programming loop.

The bit line voltage during the additional programming and the additional programming loop count for the memory cell MT to be programmed up to the state FS2 are decided based on the results of the verify operations at the two verify levels of the state FS1 for detecting whether the threshold voltage Vth has reached the verify-high level Vrf1 or the verify-low level Vrf1low.

The bit line voltage during the additional programming and the additional programming loop count for the memory cell MT to be programmed up to the state FS5 or FS7 are decided based on the results of the verify operations at the two verify levels of the state FS4 for detecting whether the threshold voltage Vth has reached the verify-high level Vrf4 or the verify-low level Vrf4low.

The bit line voltage during the additional programming and the additional programming loop count for the memory cell MT to be programmed up to the state FS9 or FS11 are decided based on the results of the verify operations at the two verify levels of the state FS8 for detecting whether the threshold voltage Vth has reached the verify-high level Vrf8 or the verify-low level Vrf8low.

The bit line voltage during the additional programming and the additional programming loop count for the memory cell MT to be programmed up to the state FS13 or FS15 are decided based on the results of the verify operations at the two verify levels of the state FS12 for detecting whether the threshold voltage Vth has reached the verify-high level Vrf12 or the verify-low level Vrf12low.

The memory cells of the state FS2, FS5, FS9, or FS13 are to be additionally programmed for one loop after the threshold voltage of said memory cell has reached the corresponding verify-high level Vrf1, Vrf4, Vrf8, or Vrf12. The memory cells of the state FS7, FS11, or FS15 are to be additionally programmed for two loops after the threshold voltage of said memory cell has reached the corresponding verify-high level Vrf4, Vrf8, or Vrf12.

The table in FIG. 23 shows the additional programming count and bit line voltages for each programming state in a case where the predefined verify operations of four states are executed.

As shown in FIG. 23, if the threshold voltage of a memory cell MT to be programmed up to the state FS1, FS4, FS8 or FS12 has directly reached the corresponding verify-high level Vrf1, Vrf4, Vrf8, or Vrf12 beyond the verify-low level during the process of step-up programming, then said memory cell MT is program-inhibited in the subsequent programming loops. On the other hand, if the threshold voltage of another certain memory cell MT to be programmed up to the state FS1, FS4, FS8, or FS12 has reached the corresponding verify-low level Vrf1 low, Vrf4low, Vrf8low, or Vrf12low, but failed in the corresponding verify-high level Vrf1, Vrf4, Vrf8, or Vrf12, then the bit line BL of said memory cell MT is biased to the QPW voltage Vbl_qpw in the subsequent programming loops.

If the threshold voltage Vth of a memory cell MT to be programmed up to FS3, FS6, FS10, or FS14 has directly reached the corresponding verify-high level Vrf1, Vrf4, Vrf8 or Vrf12 beyond the verify-low level, then said memory cell is additionally programmed with the bit line voltage of Vss (for example, 0 V) in the subsequent programming loops. The additional programming loop count is defined for each state. If the threshold voltage Vth of another memory cell MT to be programmed up to FS3, FS6, FS10 or FS14 has reached the corresponding verify-low level Vrf1low, Vrf4low, Vrf8low, or Vrf12low, but failed in the corresponding verify-high level Vrf1, Vrf4, Vrf8, or Vrf12, then a predefined QPW voltage Vbl_qpw is applied to the corresponding bit line of said memory cell in the additional programming loop.

If the threshold voltage Vth of a memory cell MT to be programmed up to FS2, FS5, FS7, FS9, FS11, FS13 or FS15 has directly reached a corresponding verify-high level (the verify-high level Vrf1, Vrf4, Vrf8 or Vrf12) beyond the verify-low level, then a predefined QPW voltage Vbl_qpw is applied to the corresponding bit line of said memory cell in the additional programming loop. On the other hand, if the threshold voltage Vth of another memory cell MT to be programmed up to FS2, FS5, FS7, FS9, FS11, FS13, or FS15 has reached a corresponding verify-low level (the verify-low level Vrf1low, Vrf4low, Vrf8low, or Vrf12low) but failed in a corresponding verify-high level (the verify-high level Vrf1, Vrf4, Vrf8, or Vrf12), then said memory cell is additionally programmed with the bit line voltage of Vss (for example 0 V) in the subsequent programming loops.

The table in FIG. 24 shows the additional programming count and bit line voltages for each programming state.

Each programming state has a group index (I, II or III), the additional programming loop count, and bit line voltages during the additional programming for two cases (the case of Vth>Vrf and the case of Vrflow<Vth<Vrf). The definitions of the values provided by the present modified embodiment are summarized in the table of FIG. 24. The definitions of the bit line voltages for the two cases are separately shown for each state.

In FIG. 24, counting of the number of additional programming loops for the group-III states starts when the threshold voltage of each of the memory cells has reached a corresponding verify-high level (the verify-high level Vrf1, Vr4f, Vrf8, or Vrf12), or a corresponding verify-low level (the verify-low level Vrf1low, Vrf4low, Vrf8low, or Vrf12low). Counting of the number of additional programming loops for the group-I and group-II states starts when the threshold voltage of each of the memory cells has directly reached a corresponding verify-high level (the verify-high level Vrf1, Vrf4, Vrf8, or Vrf12) beyond a corresponding verify-low level, or when the threshold voltage of each of the memory cells is expected to have reached a corresponding verify-high level in a programming loop that is one loop after the programming loop in which the threshold voltage of each of the memory cell has reached the corresponding verify-low level (the verify-low levels Vrf1 low, Vrf4low, Vrf8low, or Vrf12low) but failed in the verify-high level. In the fourth and fifth rows in FIG. 24, "0" indicates that the bit line BL is biased to Vss or 0 V; "+" indicates that the bit line BL is biased to Vbl_qpw (>0); and "I" indicates that the bit line BL is biased to Vinhibit so that programming is inhibited.

For example, the additional programming loop count for memory cells of the state FS4 (group-III) is zero according to FIG. 24. Therefore, the memory cells to be programmed up to the state FS4, the threshold voltages of which have directly passed the verify-high level Vrf4 beyond the verify-low level Vrf4low, are program-inhibited from the next programming loop. On the other hand, the memory cells of the state FS4, the threshold voltages of which have passed the verify-low level Vrf4low but have not passed the verify-high level Vrf4, are to be programmed under the QPW voltage Vbl_qpw until the threshold voltages of the memory cells are definitely confirmed to have reached the verify-high level Vrf1 and program-inhibited from the next loop.

Similarly, the additional programming loop count for memory cells of the state FS7 (group-III) is two according to FIG. 24. Therefore, the memory cells of the state FS7 are to be additionally programmed for two loops after the threshold voltages of said memory cells have reached either the verify-low level Vrf4low or the verify-high level Vrf4. If the threshold voltages of the memory cells to be programmed to the state FS7 have directly reached the verify-high level Vrf4 beyond the verify-low level Vrf4low, the bit line voltage is set to Vbl_qpw during the additional programming. If the threshold voltages of the memory cells to be programmed up to the state FS7 have reached the verify-low level Vrf4low but have not reached the verify-high level Vrf4, the bit line voltage is set to Vss or 0 V during the additional programming.

The above-described modified embodiment 2 is also a particular case of the two-pass foggy and fine programming in which the improved reduced verify technique is adopted for the first programming pass. Similarly to the other modified embodiments, the foggy programming pass can be accelerated by applying the above-mentioned improved reduced verify technique with shared verify-read operations in only four programming states.

Computer simulations similarly predict that the improved reduced verify programming technique with four-state eight verify levels described above does not degrade threshold voltage distributions.

Modified Embodiment 3

In the first embodiment described above, during the foggy programming, the verify operations at the two verify levels around the lower tail of the state FS1 is executed in common for all memory cells to be programmed to the states FS1 to FS15. In the modified embodiment 1 described above, during the foggy programming, verify operations at the two verify levels around the lower tail of the state FS1 are executed for the memory cells to be programmed to the states FS1 to FS7, and the verify operations at the two verify levels around the lower tail of the state FS8 are executed for the memory cells to be programmed to the states FS8 to FS15. In the modified embodiment 2 described above, during the foggy programming, the verify operations at the two verify levels around the lower tail of each of the four states FS1, FS4, FS8 and FS12 are executed for a corresponding programming state among FS1 to FS15. In any of the embodiment and the modified embodiments, counting of the number of additional programming loops for the memory cells MT belonging to the groups I and II starts when the verify-high level has been reached or when the verify-high level is expected to have been reached. However, counting of the number of additional programming loops for the memory cells MT belonging to the groups I and II can start when the verify-low level is reached.

The table in FIG. 25 shows the additional programming count and the bit line voltages for each programming state in a case where verify operations are executed at two verify levels around the lower tail of each of the two states FS1 and FS8 similarly to the modified embodiment 1. The second row in FIG. 25 shows the additional programming loop count for the memory cells, the threshold voltages of which have passed the verify-low level but failed in the verify-high level. The third row in FIG. 25 shows the additional programming loop count for the memory cells, the threshold voltages of which have directly reached the verify-high level beyond the verify-low level. Numerals on the second and third rows indicate the additional programming loop count from a programming loop in which the threshold voltages of memory cells have reached the verify-low level. The fourth row in FIG. 25 shows the bit line voltages of the memory cells, the threshold voltages of which have passed the verify-low level but failed in the verify-high level during the additional programming. The fifth row in FIG. 25 shows the bit line voltages of memory cells, the threshold voltages of which have directly reached the verify-high level beyond the verify-low level, during the additional programming.

In the fourth and fifth rows in FIG. 25, "0" indicates that the bit line BL is biased to Vss or 0 V; "+" indicates that the bit line BL is biased to Vbl_qpw (>0); and "I" indicates that the bit line BL is biased to Vinhibit so that programming is inhibited.

For example, when the threshold voltages of the memory cells to be programmed up to the state FS4 have reached the verify-low level but have not reached the verify-high level during the process of step-up programming, said memory cells are programmed for two additional programming loops under the grounded bit line voltage Vss. When the threshold voltages of the memory cells to be programmed up to the state FS4 have directly reached the verify-high level beyond the verify-low level, said memory cells are programmed for two additional programming loops under the bit line voltage equal to the QPW voltage Vbl_qpw.

For example, when the threshold voltages of the memory cells to be programmed up to the state FS7 have reached the verify-low level but have not reached the verify-high level during the process of step-up programming, said memory cells are similarly programmed for four additional programming loops under the grounded bit line voltage Vss. When the threshold voltages of the memory cells to be programmed up to the state FS7 have directly reached the verify-high level beyond the verify-low level, said memory cells are similarly programmed for three additional programming loops under the bit line voltage equal to the QPW voltage Vbl_qpw.

Such settings also improve the data programming speed for the foggy programming.

Modified Embodiment 4

In the embodiment and each modified embodiment described above, detection that the threshold voltage Vth has reached the verify-low level is performed by executing a sense operation by the sense amplifier circuit 24 under each of two word line voltages, which correspond to the verify-low level and the verify-high level, successively applied to the word line WL. However, it is also possible to detect threshold voltages by causing two sense operations of the sense amplifier circuit 24 having two different operation parameters (for example, sensing duration) to be executed under only one word line voltage corresponding to the verify-high level.

As described above, the embodiment and each modified embodiment described above can provide a semiconductor storage apparatus that shortens data programming duration.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modified embodiments as would fall within the scope and spirit of the inventions.

What is claimed is:

1. A semiconductor storage apparatus comprising:
   a memory cell array provided with a plurality of memory cells each of which is configured to be set to one of a plurality of threshold voltage levels;
   a word line connected to each of gates of the memory cells;
   a word line driver configured to apply a voltage to the word line;
   a plurality of bit lines connected respectively to ends of the memory cells;
   a sense amplifier circuit configured to detect data of the memory cells via the bit lines; and
   a control circuit configured to control the word line driver and the sense amplifier circuit to program data to the memory cells,
   wherein the control circuit controls the word line driver and the sense amplifier circuit so as to perform a first programming pass and a second programming pass that is performed after the first programming pass, the first programming pass programming data of a plurality of states each of which has a first threshold distribution width to the memory cells, the second programming pass programming data of the states each of which has a second threshold distribution width narrower than the first threshold distribution width to the memory cells, wherein the first programming pass includes a plurality of programming loops, each of the programming loops including a program operation for causing an increase of a threshold voltage of each of the memory cells, at least one of the programming loops including a verify operation for judging whether the threshold voltage of each of the memory cells has reached a target value, wherein, in the first programming pass, a first verify operation is performed in one of the programming loops to judge whether the threshold voltage of each of the memory cells is between a first verify level and a second verify level lower than the first verify level; and an additional program operation is performed in one or more subsequent programming loops after the one of the programming loops on a part of the memory cells to be programmed to a target state higher than the first verify level, and wherein a number of the additional program operations to be performed and a bit line voltage applied to each of the part of the memory cells are set based on a result of the first verify operation and the target state of the part of the memory cells.

2. The semiconductor storage apparatus according to claim 1, wherein the word line driver applies a programming voltage to the word line in the program operation in each of the programming loops of the first programming pass; and the control circuit sets a step-up width of the programming voltages in the additional program operations between two consecutive programming loops so that the increase of the threshold voltage of each of the memory cells becomes a value corresponding to an integer multiple of a threshold voltage difference between two consecutive states, the integer multiple being equal to or larger than two.

3. The semiconductor storage apparatus according to claim 2, wherein the states includes a first state with a lowest threshold voltage level and a second state with a second lowest threshold voltage level next to the lowest threshold voltage level, and the first verify level and the second verify level are verify levels for the second state.

4. The semiconductor storage apparatus according to claim 1, wherein the states are classified into three groups of first, second and third groups; and application of the bit line voltage in the additional program operation is different for each of the groups.

5. The semiconductor storage apparatus according to claim 4, wherein:

when the target state is a state belonging to the first group, if the threshold voltage is between the first verify level and the second verify level, the control circuit sets the bit line voltage to a predetermined positive voltage in the program operation of a next programming loop, and if the threshold voltage is equal to or higher than the first verify level, the control circuit inhibits the program operation of the next programming loop;

when the target state is one of states belonging to the second group, if the threshold voltage is between the first verify level and the second verify level, the control circuit sets the bit line voltage to the predetermined positive voltage and then performs the additional program operation, and if the threshold voltage is equal to or higher than the first verify level, the control circuit performs the additional program operation; and when the target state is one of states belonging to the third group, if the threshold voltage is between the first verify level and the second verify level, the control circuit performs the additional program operation, and if the threshold voltage is equal to or higher than the first verify level, the control circuit sets the bit line voltage to the predetermined positive voltage and then performs additional program operation.

6. The semiconductor storage apparatus according to claim 4, wherein the states belonging to the second group are states of a plurality of threshold voltage distributions, the states corresponding to every other states from the state belonging to the first group, among the states; and the states belonging to the third group are states of a plurality of threshold voltage distributions, the states corresponding to a state next to the state belonging to the first group and every other states from the state next to the state belonging to the first group, among the states.

7. The semiconductor storage apparatus according to claim 3, wherein the first verify operation includes judgment about whether each of the threshold voltage levels is between a third verify level and a fourth verify level, the third verify level being for states higher than the second state, the fourth verify level being lower than the third verify level.

8. The semiconductor storage apparatus according to claim 2, wherein the step-up width is almost twice a value corresponding to the threshold voltage difference between consecutive states.

9. The semiconductor storage apparatus according to claim 2, wherein a difference between the first verify level and the second verify level is almost same as the value corresponding to the threshold voltage difference between consecutive states.

10. The semiconductor storage apparatus according to claim 1, wherein in the first programming pass, the control circuit does not perform the verify operation in the subsequent programming loops in which the additional program operation is performed after the first verify operation has been performed.

* * * * *